United States Patent
Ohtani et al.

(10) Patent No.: US 6,545,320 B2
(45) Date of Patent: Apr. 8, 2003

(54) ELECTRO-OPTICAL DEVICE AND SEMICONDUCTOR DEVICE

(75) Inventors: Hisashi Ohtani, Kanagawa (JP); Jun Koyama, Kanagawa (JP); Shunpei Yamazaki, Tokyo (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 10/161,695

(22) Filed: Jun. 5, 2002

(65) Prior Publication Data

US 2002/0149056 A1 Oct. 17, 2002

Related U.S. Application Data

(62) Division of application No. 09/907,708, filed on Jul. 19, 2001, now Pat. No. 6,407,430, which is a division of application No. 09/452,390, filed on Dec. 1, 1999, now Pat. No. 6,303,963.

(30) Foreign Application Priority Data

Dec. 3, 1998 (JP) .............................. 10-344230

(51) Int. Cl.⁷ ..................... H01L 27/01; H01L 27/12; H01L 31/0392
(52) U.S. Cl. ..................... 257/350; 257/59; 257/70; 257/72; 257/627
(58) Field of Search ................. 257/59, 70, 72, 257/350, 627

(56) References Cited

U.S. PATENT DOCUMENTS

| | | |
|---|---|---|
| 4,766,477 A | 8/1988 | Nakagawa et al. |
| 4,933,298 A | 6/1990 | Hasegawa |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,563,426 A | 10/1996 | Zhang et al. |
| 5,569,610 A | 10/1996 | Zhang et al. |

(List continued on next page.)

FOREIGN PATENT DOCUMENTS

| | | |
|---|---|---|
| JP | 57-160121 | 10/1982 |
| JP | 01-135014 | 5/1989 |
| JP | 07-130652 | 5/1995 |
| JP | 07-135318 | 5/1995 |
| JP | 07-321339 | 12/1995 |
| JP | 08-078329 | 3/1996 |
| JP | 08-139019 | 5/1996 |

OTHER PUBLICATIONS

Ohtani et al., "Late–News Poster: A 60–in. HDTV Rear–Projector with Continuous–Grain–Silicon–Technology", pp. 467–470, 1998, SID 98 Digest.

*Primary Examiner*—Ngân V. Ngô
(74) *Attorney, Agent, or Firm*—Nixon Peabody LLP; Jeffrey L. Costellia

(57) ABSTRACT

A high performance circuit is formed by using a TFT with less fluctuation in characteristics, and a semiconductor device including such a circuit is formed. When the TFT is formed, first, a base film and a semiconductor film are continuously formed on a quartz substrate without exposing to the air. After the semiconductor film is crystallized by using a catalytic element, the catalytic element is removed. In the TFT formed in such a process, fluctuation in electrical characteristics such as a threshold voltage and a subthreshold coefficient is extremely small. Thus, it is possible to form a circuit, such as a differential amplifier circuit, which is apt to receive an influence of characteristic fluctuation of a TFT.

42 Claims, 22 Drawing Sheets

U.S. PATENT DOCUMENTS

| | | |
|---|---|---|
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,648,277 A | 7/1997 | Zhang et al. |
| 5,654,203 A | 8/1997 | Ohtani |
| 5,656,825 A | 8/1997 | Kusumoto et al. |
| 5,663,077 A | 9/1997 | Adachi et al. |
| 5,677,549 A | 10/1997 | Takayama et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,822 A | 4/1998 | Takayama et al. |
| 5,744,824 A | 4/1998 | Kousai et al. |
| 5,756,364 A | 5/1998 | Tanaka et al. |
| 5,766,977 A | 6/1998 | Yamazaki |
| 5,773,327 A | 6/1998 | Yamazaki et al. |
| 5,773,846 A | 6/1998 | Zhang et al. |
| 5,773,847 A | 6/1998 | Hayakawa |
| 5,783,468 A | 7/1998 | Zhang et al. |
| 5,795,795 A | 8/1998 | Kousai et al. |
| 5,808,321 A | 9/1998 | Mitanaga et al. |
| 5,811,327 A | 9/1998 | Funai et al. |
| 5,814,540 A | 9/1998 | Takemura et al. |
| 5,818,076 A | 10/1998 | Zhang et al. |
| 5,821,138 A | 10/1998 | Yamazaki et al. |
| 5,824,573 A | 10/1998 | Zhang et al. |
| 5,824,574 A | 10/1998 | Yamazaki et al. |
| 5,830,784 A | 11/1998 | Zhang et al. |
| 5,837,619 A | 11/1998 | Adachi et al. |
| 5,840,118 A | 11/1998 | Yamazaki |
| 5,843,225 A | 12/1998 | Takayama et al. |
| 5,843,833 A | 12/1998 | Ohtani et al. |
| 5,851,862 A | 12/1998 | Ohtani et al. |
| 5,858,823 A | 1/1999 | Yamazaki et al. |
| 5,869,362 A | 2/1999 | Ohtani |
| 5,869,363 A | 2/1999 | Yamazaki et al. |
| 5,879,977 A | 3/1999 | Zhang et al. |
| 5,882,960 A | 3/1999 | Zhang et al. |
| 5,886,366 A | 3/1999 | Yamazaki et al. |
| 5,888,857 A | 3/1999 | Zhang et al. |
| 5,888,858 A | 3/1999 | Yamazaki et al. |
| 5,897,347 A | 4/1999 | Yamazaki et al. |
| 5,904,770 A | 5/1999 | Ohtani et al. |
| 5,923,962 A | 7/1999 | Ohtani et al. |
| 5,959,314 A | 9/1999 | Voutsas et al. |
| 5,962,872 A | 10/1999 | Zhang et al. |
| 5,970,330 A | 10/1999 | Buynoski |
| 5,998,841 A | 12/1999 | Suzawa |
| 6,303,963 B1 | 10/2001 | Ohtani et al. |

Peripheral Circuit (CMOS Circuit) | Pixel Matrix Circuit

ELECTRO-OPTICAL DEVICE AND SEMICONDUCTOR DEVICE

BACKGROUND OF THE INVENTION

1. Field of the Invention

The present invention relates to a semiconductor thin film formed on a substrate having an insulating surface and a semiconductor device formed of a TFT having an active layer of the thin film. Particularly, the invention relates to a structure in a case where a material containing silicon as its main ingredient is used as a semiconductor thin film.

Incidentally, in the present specification, the term "semiconductor device" indicates any devices functioning by using a semiconductor, and the following are included in the category of the semiconductor device.

(1) Single device such as a thin film transistor (TFT).
(2) Semiconductor circuit using the single device of (1).
(3) Electro-optical device formed using (1) or (2).
(4) Electronic device (electronic equipment) including (2) or (3).

2. Description of the Related Art

In recent years, attention has been paid to a technique for constructing a thin film transistor (hereinafter referred to as a "TFT") by using a semiconductor thin film (its thickness is several tens to several hundreds nm) formed on a substrate having an insulating surface. The thin film transistor is widely used for an electronic device such as an IC or an electro-optical device, and particularly as a switching element of an image display device, its development has been hastened.

For example, in a liquid crystal display device, an attempt to apply the TFT to any electric circuits, such as a pixel matrix circuit for controlling each of pixel regions arranged in matrix form, a driver circuit for controlling the pixel matrix circuit, and a logic circuit (a processor circuit, a memory circuit, etc.) for processing a data signal from the outside, has been made.

Under the present circumstances, although a TFT using a noncrystalline silicon film (amorphous silicon film) as an active layer has been put to practical use, a TFT using a crystalline silicon film (typically, a polysilicon film, a polycrystalline silicon film, etc.) is necessary for an electric circuit expected to have further high speed operating performance, such as a driver circuit and a logic circuit.

For example, as a method of forming a crystalline silicon film on a glass substrate, techniques disclosed in Japanese Patent Laid-Open Application No. Hei. 7-130652 and No. Hei. 8-78329 by the present applicant are well known. The techniques disclosed in these publications use a catalytic element for promoting crystallization of an amorphous silicon film, so that formation of a crystalline silicon film superior in crystallinity is made possible by a heat treatment at 500 to 600° C. for about 4 hours.

Particularly, the technique disclosed in Japanese Patent Laid-Open Application No. Hei. 8-78329 is such that crystal growth almost parallel to a substrate surface is made by applying the above techniques, and the present inventor et al. refer to a formed crystallized region especially as a side growth region (or a lateral grow region).

However, a TFT has a defect that fluctuation in electric characteristics (characteristic fluctuation) is large as compared with a MOSFET formed on a silicon wafer. Thus, it is difficult to reproduce the same characteristics even if TFTs have the same structure, which has made it difficult to form a circuit with the TFTs.

A technique for forming a high performance TFT with less characteristic fluctuation becomes necessary for realization of a system-on-panel at which the present applicant is aiming. That is, in order to realize the system-on-panel, it is necessary to use a TFT in which not only an operating speed is high (electric field mobility is large) but also fluctuation in electric characteristics representing a TFT, such as a threshold voltage and a subthreshold coefficient, is suppressed.

SUMMARY OF THE INVENTION

The present invention has been made in response to the foregoing request, and an object of the invention is to provide a method of fabricating a TFT having high performance and less fluctuation in characteristics, which can form such a high performance semiconductor circuit that its fabrication using a conventional TFT has been impossible.

Another object of the invention is to provide a semiconductor circuit and an electro-optical device formed of such TFTs, and an electronic device having those as parts.

The constitution of the present invention is as follows.

A semiconductor device having a circuit including a plurality of TFTs formed on a same substrate, wherein:

in a channel formation region of each of the plurality of TFTs, a plane orientation exhibits a {110} orientation, and 90% or more of crystal lattices have continuity at crystal grain boundaries; and when a collective of threshold voltages (Vth) exhibited by the plurality of the respective TFTs is made a population, a standard deviation ($\sigma$) is 0.1 V or less.

Further, a semiconductor device having a circuit including of a plurality of TFTs formed on a same substrate, wherein:

an electron beam diffraction pattern observed when an electron beam is vertically irradiated to a channel formation region of each of the plurality of TFTs exhibits regularity peculiar to a {110} orientation; and when a collective of threshold voltages (Vth) exhibited by the plurality of the respective TFTs is made a population, a standard deviation ($\sigma$) is 0.1 V or less.

Incidentally, in the above structure, the threshold voltage is a value of a dot where a tangential line having a maximum slope among tangential lines of a curve which is obtained by plotting gate voltages in an X axis and the square roots of drain currents in a Y axis (measurement is made at source voltage: 0 V, drain voltage: 11 V, and gate voltage: −20 to 20 V), intersects with the X axis. Such a method of obtaining a threshold voltage is generally referred to as a root ID extrapolation (ID is a drain current).

Another constitution of the present invention is as follows.

A semiconductor device having a circuit including of a plurality of TFTs formed on a same substrate, wherein:

in a channel formation region of each of the plurality of TFTs, a plane orientation exhibits a {110} orientation, and 90% or more of crystal lattices have continuity at crystal grain boundaries; and when a collective of subthreshold coefficients (S-values) exhibited by the plurality of the respective TFTs is made a population, a standard deviation ($\sigma$) is 10 mV/dec. or less.

Further, a semiconductor device having a circuit including of a plurality of TFTs formed on a same substrate, wherein:

an electron beam diffraction pattern observed when an electron beam is vertically irradiated to a channel formation region of each of the plurality of TFTs exhibits regularity peculiar to a {110} orientation; and when a collective of subthreshold coefficients (S-values) exhibited by the plurality of the respective TFTs is made a population, a standard deviation (σ) is 10 mV/dec. or less.

Incidentally, in the above structure, the subthreshold coefficient is a reciprocal of a slope of a tangential line having a maximum slope among tangential lines of a curve obtained by plotting gate voltages in an X axis and the square roots of drain currents in a Y axis (measurement is made at source voltage: 0 V, drain voltage: 1 V, and gate voltage: −20 to 20 V). In general, the coefficient is expressed by an equation of ln 10·kT/q [1+(Cd+Cit)/Cox]. Where, k is the Boltzmann constant, T is absolute temperature, q is an amount of electric charge, Cd is depletion layer capacitance, Cit is equivalent capacitance of interface level, and Cox is gate capacitance.

The present invention realizes a high performance TFT having features such as the foregoing structure, and realizes a high performance semiconductor device by forming a circuit using the TFT.

DETAILED DESCRIPTION OF THE PREFERRED EMBODIMENTS

The structure of the present invention will be described in detail with embodiments set forth below.

[Embodiment 1]

In this embodiment, a description will be made on an example in which an N-channel TFT (hereinafter referred to as an "NTFT") and a P-channel TFT (hereinafter referred to as a "PTFT") are formed on the same substrate by using the present invention, and an AM-LCD (active matrix type liquid crystal display) is fabricated. Specifically, an AM-LCD including a CMOS circuit as a driver circuit and a pixel TFT as a pixel matrix circuit will be described as an example.

First, a quartz substrate 10 was prepared as a substrate. Instead of the quartz substrate, a silicon substrate provided with a thermal oxidation film may be used. Besides, such a method may be adopted that an amorphous silicon film is temporarily formed on a quartz substrate, and it is completely thermally oxidized to make an insulating film. Moreover, a ceramic substrate or a metal substrate provided with an insulating film may be used.

This embodiment is characterized in that here, a base film and a semiconductor film are continuously formed without exposing to the air. The reason is to prevent the interface between the semiconductor film and the base film from being polluted by boron in the air. Besides, it has been found that the crystallinity of the semiconductor film on the base film having a certain degree of softness becomes superior to that on the hard quartz.

The fluctuation in threshold voltage was greatly reduced by reducing the boron pollution. Besides, it was found that the crystallinity was also greatly improved. Data indicating those will be set forth later.

Figure 1A:
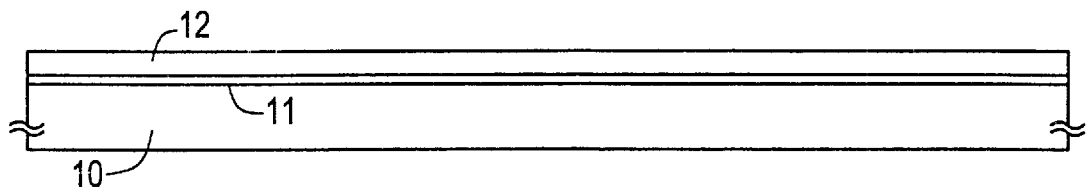
FIGS. 1A to 1E are views showing fabricating steps of an AM-LCD.

In this embodiment, a silicon oxide film with a thickness of 15 nm was formed as a base film 11 on the quartz substrate 10, and an amorphous silicon film 12 was continuously formed thereon without exposing to the air. The base film 11 and the amorphous silicon film 12 were formed by a plasma CVD method. Adjustment was made so that the final thickness (thickness determined in view of a film decrease after thermal oxidation) of the amorphous silicon film 12 became 10 to 75 nm (preferably 15 to 45 nm) (FIG. 1A).

Of course, instead of the amorphous silicon film, another amorphous semiconductor film may be used, or a microcrystalline semiconductor film may be used. Incidentally, it is desirable to thoroughly make management of impurity concentration in the film at the film formation.

In the case of this embodiment, management is made so that the concentration of any of C (carbon), N (nitrogen), O (oxygen), and S (sulfur) as typical impurities in the amorphous silicon film 12 is made less than $5 \times 10^{18}$ atoms/cm$^3$ (preferably $1 \times 10^{18}$ atoms/cm$^3$ or less). If each of the impurities exists at a concentration exceeding this, it has a bad influence at crystallization, and it can become a cause to lower film quality after crystallization.

The concentration of hydrogen in the amorphous silicon film 12 is also an important parameter, and there is also a case where a film with superior crystallinity is obtained when the hydrogen content is made low. In that case, it is appropriate that film formation of the amorphous silicon film 12 is made by a low pressure thermal CVD method.

Next, a crystallizing step of the amorphous silicon film 12 was carried out. As means for crystallization, a technique disclosed in Japanese Patent Laid-Open Application No. Hei. 7-130652 by the present inventor is used. Although any of embodiment 1 and embodiment 2 of the publication may be used, the technical content (disclosed in Japanese Patent Laid-Open Application No. Hei. 8-78329 in detail) of the embodiment 2 of the publication was used in the present invention.

According to the technique disclosed in Japanese Patent Laid-Open Application No. Hei. 8-78329, a mask insulating film 13 for selecting an addition region of a catalytic element was first formed. The mask insulating film 13 has a plurality of opening portions for adding the catalytic element. It was possible to determine the positions of crystal regions by the positions of the opening portions.

Figure 1B:
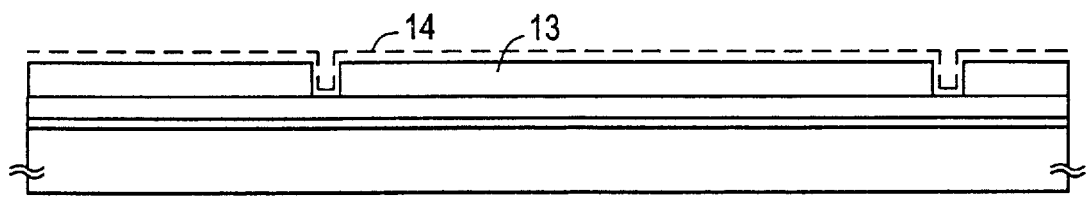

Then a solution containing nickel (Ni) as the catalytic element for promoting crystallization of the amorphous silicon film was applied by a spin coating method to form a Ni-containing layer 14. As the catalytic element, cobalt (Co), iron (Fe), palladium (Pd), platinum (Pt), copper (Cu), gold (Au), germanium (Ge), etc. may be used instead of nickel (FIG. 1B).

As the adding step of the catalytic element, an ion implantation method using a resist mask or a plasma doping method may be used. In this case, since it becomes easy to reduce an occupied area of an added region and to control a growth distance of a lateral growth region, it becomes an effective technique when a minute circuit is constructed.

Next, after the adding step of the catalytic element was ended, dehydrogenating at about 500° C. for 1 hour was carried out, and then, a heat treatment at 500 to 700° C. (typically 550 to 650° C.) for 4 to 24 hours was carried out so that the amorphous silicon film 12 was transformed (crystallized) into a crystalline silicon film. In this embodiment, a heat treatment at 580° C. for 14 hours was carried out in a nitrogen atmosphere.

Figure 1C:
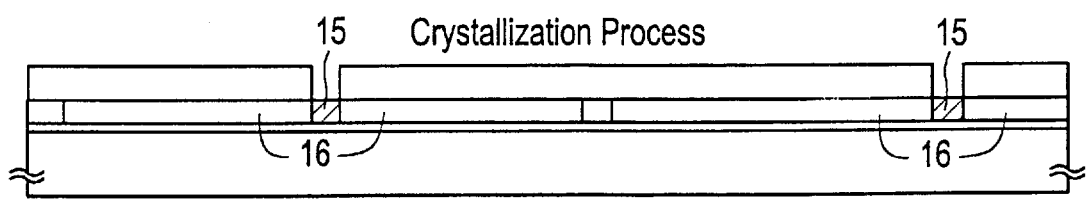
Figure 1D:
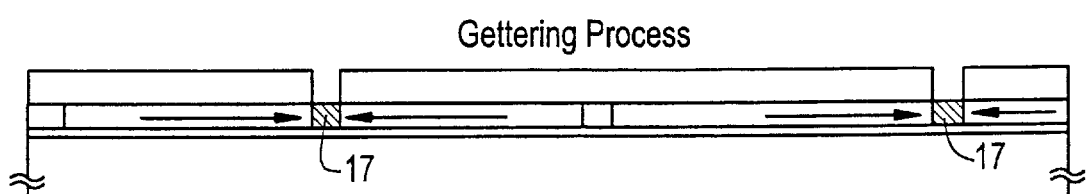
Figure 1E:
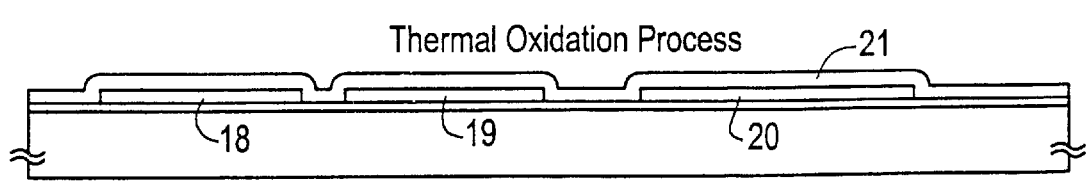

At this time, crystallization of the amorphous silicon film 12 progressed preferentially from nuclei generated in a region 15 added with nickel, and a crystal region (crystalline silicon film) 16 grown almost parallel to a substrate surface of the substrate 10 was formed. The present inventor et al. refer to this crystal region 16 as a lateral growth region. The lateral growth region has an advantage that crystallinity is superior as a whole since individual crystals are gathered in a relatively aligned state (FIG. 1C).

After the heat treatment for crystallization was ended, an adding step of phosphorus was carried out using the mask insulating film 13 without any change as a mask. By using the mask insulating film 13 as it is, a lowering of throughput was prevented. In the adding step of phosphorus, an acceleration voltage was made 10 keV, and a dose amount was adjusted such that phosphorus was added into the semiconductor film at a concentration of $1 \times 10^{18}$ to $1 \times 10^{20}$ atoms/cm$^3$. In this way, a phosphorus added region 17 was formed.

After the phosphorus added region 17 was formed, a heat treatment step was carried out at a temperature of 550 to 700° C. (typically 600 to 650° C.) for 2 to 16 hours (typically 4 to 12 hours, preferably 4 to 6 hours). Nickel contained in the crystal region 16 was diffused (as indicated by arrows) by this heat treatment, and was combined with phosphorus in the phosphorus added region 17 to be captured. As a result, a concentration of nickel in the crystal region 16 became $5 \times 10^{17}$ atoms/cm$^3$ or less (typically $1 \times 10^{14}$ to $1 \times 10^{16}$ atoms/cm$^3$).

Incidentally, a concentration of an element in the present specification is defined as a minimum value of measured values by SIMS (Secondary Ion Mass Spectrometry).

This heat treatment step is carried out for the purpose of removing nickel in the semiconductor film by using the feature that nickel is gettered (captured) by phosphorus. The present applicant refers to this heat treatment step as a gettering step using phosphorus.

Next, the mask insulating film 13 was removed and patterning was carried out, so that island-like semiconductor layers (active layers) 18 to 20 made of only the lateral growth regions 16 were formed. In this embodiment, the active layer 18 is used for an N-channel TFT of a CMOS circuit, the active layer 19 is used for a P-channel TFT of the CMOS circuit, and the active layer 20 is used for a pixel TFT of a pixel matrix circuit.

Next, a gate insulating film 21 made of an insulating film containing silicon was formed. The thickness of the gate insulating film 21 may be adjusted within the range of 20 to 250 nm in view of an increase by a subsequent thermal oxidation step as well. As a film formation method, a well-known vapor phase method (a plasma CVD method, a sputtering method, etc.) may be used.

Next, a heat treatment is carried out at a temperature of 700 to 1150° C. (typically 800 to 1000° C.) for 0.1 to 6 hours (typically 0.5 to 1 hour). At this time, a processing atmosphere is made an oxidizing atmosphere. In this embodiment, a heat treatment at 950° C. for 75 minutes was carried out in an atmosphere containing oxygen and an halogen element.

By this heat treatment (thermal oxidation) step, the active layers 18 to 20 were oxidized, and thermal oxidation films (silicon oxide films) were formed between the active layers and the gate insulating film 21. That is, the thickness of the active layers is decreased, and the thickness of the gate insulating film is increased. In this embodiment, adjustment was made such that the thickness of the active layers 18 to 20 finally became 35 nm and the thickness of the gate insulating film 21 became 100 nm.

The halogen element was made to be contained at a concentration of 0.5 to 10 vol % (in this embodiment, 3 vol %) with respect to oxygen. As a compound gas containing the halogen element, a kind of or plural kinds of gases selected from HCl, HF, NF$_3$, HBr, Cl$_2$, ClF$_3$, BCl$_3$, F$_2$, and Br$_2$ may be used. Of course, it is also possible to carry out the heat treatment in an atmosphere of only oxygen in which the halogen element is not added.

By making the halogen element contained in this step, nickel remaining in the active layer is further decreased by the gettering function of the halogen element. Like this, it becomes possible to further remove the catalytic element by combining the gettering step using phosphorus and the gettering step using the halogen element.

Besides, by the foregoing heat treatment, thermal oxidation reaction progressed at the interfaces between the active layers 18 to 20 and the gate insulating film 21, so that it was possible to obtain semiconductor/insulating film interfaces with very few interfacial levels. There is also an effect to prevent bad formation (edge thinning) of the thermal oxidation films at the ends of the active layers.

Further, it was also effective to improve the film quality of the gate insulating film 21 by carrying out a heat treatment at about 800 to 1100° C. in a hydrogen or nitrogen atmosphere after the foregoing heat treatment in the halogen atmosphere was carried out.

Next, a not-shown metal film containing aluminum as its main ingredient was formed, and originals 22 to 24 of subsequent gate wiring lines (including gate electrodes) were formed by patterning. In this embodiment, an aluminum film containing scandium at 2 wt % was used.

Figure 2A:
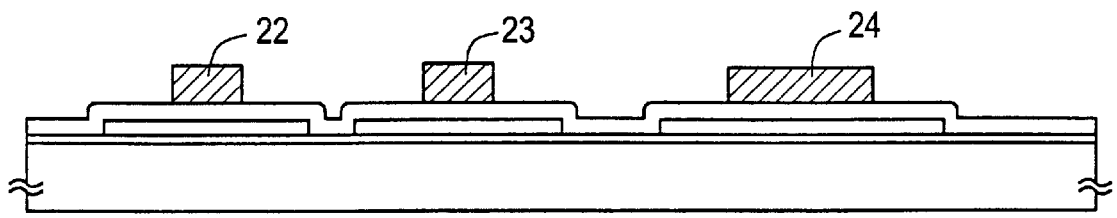
FIGS. 2A to 2D are views showing fabricating steps of the AM-LCD.

Incidentally, in addition to this, it is also possible to use a tantalum film, a silicon film having conductivity, or the like (FIG. 2A).

Here, the technique disclosed in Japanese Patent Laid-Open Application No. Hei. 7-135318 by the present applicant was used. The publication discloses a technique in which a source region, a drain region, and a low concentration impurity region are formed in a self-aligned manner using an oxide film formed by anodic oxidation.

First, an anodic oxidation processing was carried out in a solution of 3% oxalic acid while a resist mask (not shown) used for patterning of the aluminum film remained, so that porous anodic oxidation films 25 to 27 were formed.

The thickness of the porous anodic oxidation films 25 to 27 increased in proportion to time. Since the resist mask remained on the upper surface, they were formed at only the sides of the originals 22 to 24 of the gate electrodes. In the technique of Japanese Patent Laid-Open Application No. Hei. 7-135318, this film thickness subsequently becomes a length of a low concentration impurity region (also called an LDD region). In this embodiment, the anodic oxidation processing was carried out under such a condition that the film thickness became 500 nm.

Next, after the not-shown resist mask was removed, an anodic oxidation processing was carried out in an electrolyte of an ethylene glycol solution mixed with 3% tartaric acid. By this processing, dense nonporous anodic oxidation films 28 to 30 were formed. Since the electrolyte permeated also into the inner portions of the porous anodic oxidation films, they were also formed in the inside thereof.

The thickness of the nonporous anodic oxidation films 28 to 30 are determined according to a voltage applied. In this embodiment, the anodic oxidation processing was carried out at an applied voltage of 80 V so that the film thickness became about 100 nm.

Patterns (designated by 31 to 33) remaining after the foregoing two anodic oxidation processes substantially function as the gate wiring lines (including the gate electrodes).

Figure 2B:
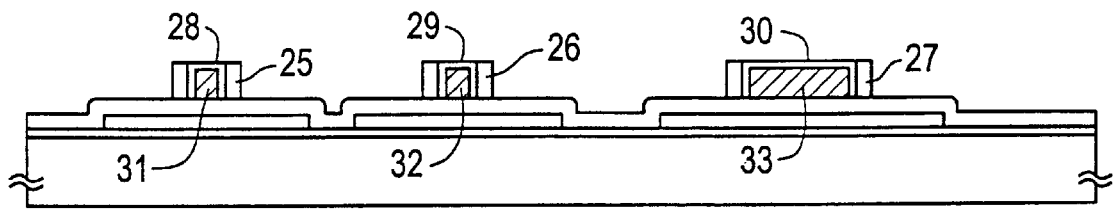
Figure 2C:
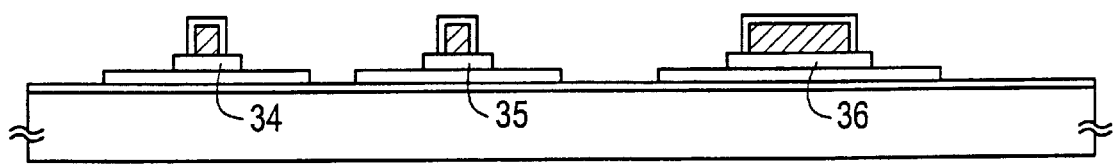
Figure 2D:
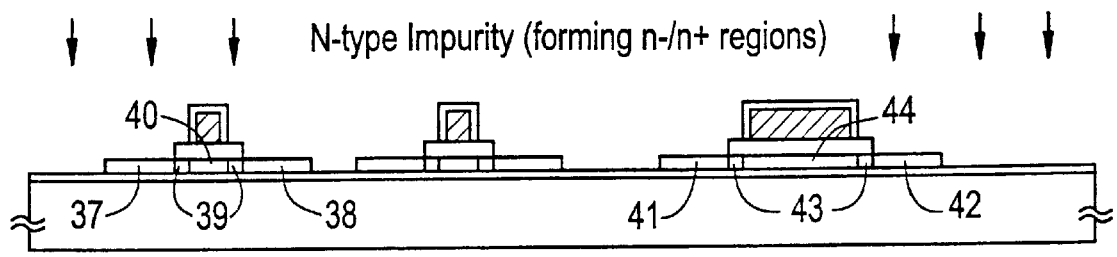

After the state of FIG. 2B was obtained in this way, the gate insulating film 21 was next etched by a dry etching method using the gate electrodes 22 to 24 and the porous anodic oxidation films 25 to 27 as masks. Then the porous anodic oxidation films 25 to 27 were removed. The ends of the gate insulating films 34 to 36 formed in this way became in such a state that they were exposed by the film thickness of the porous anodic oxidation films 25 to 27 (FIG. 2C).

Next, an impurity (in this embodiment, phosphorus) to give an N type was added to the whole substrate. In this embodiment, first impurity addition was carried out at a high acceleration voltage and an n$^-$ region was formed. At this time, since the acceleration voltage was as high as about 80 keV, the impurity element was added into not only the surfaces of the active layers but also portions under the ends of the exposed gate insulating films. Adjustment was made so that the impurity concentration of this n$^-$ region became $1 \times 10^{18}$ to $1 \times 10^{19}$ atoms/cm$^3$.

Further, second impurity addition was carried out at a low acceleration voltage and an n$^+$ region was formed. At this time, since the acceleration voltage is as low as about 10 keV, the gate insulating films function as masks. Adjustment was made so that the sheet resistance of this n$^+$ region became 500Ω or less (preferably 300Ω or less).

In the N-channel TFT of the CMOS circuit, a source region 37, a drain region 38, a low concentration impurity region (LDD region) 39, and a channel formation region 40 were formed through the foregoing steps. In the pixel TFT (N-channel TFT) of the pixel matrix circuit, a source region 41, a drain region 42, a low concentration impurity region (LDD region) 43, and a channel formation region 44 were formed. Although the same structure is formed in a region which becomes a P-channel TFT, a description will not be made here.

At this time, the source regions 37 and 41 and the drain regions 38 and 42 were formed of the foregoing n$^+$ regions, and the low concentration impurity regions 39 and 43 were formed of the n$^-$ regions. The regions just under the gate electrodes were not added with an impurity element, and became intrinsic or substantially intrinsic channel formation regions 40 and 44.

Incidentally, the term "substantially intrinsic" means that an intentionally added impurity is not contained. However, the impurity here does not include boron or gallium added to control a threshold voltage or to prevent punchthrough.

Next, the N-channel TFTs were covered with resist masks 45, and an adding step of an impurity (in this embodiment, boron) to give a P type was carried out. In this step, an acceleration voltage was set at as high as 70 keV, and boron was added at a concentration about three times as high as that of the n$^+$ region. Also at this time, adjustment was made so that the sheet resistance became 500Ω or less (preferably 300Ω or less) (FIG. 3A).

By this step, a source region 46, a drain region 47, and a channel formation region 48 of the P-channel TFT were formed. Like this, this embodiment adopted such a structure that the low concentration impurity regions were provided at only the N-channel TFTs.

Figure 3A:
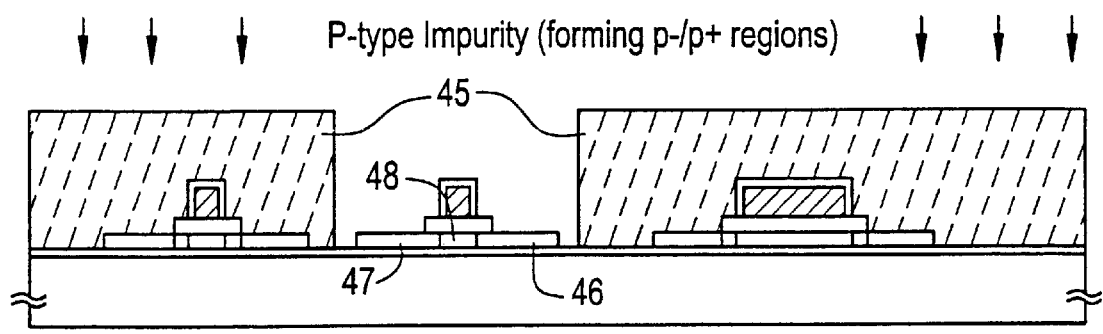
FIGS. 3A to 3C are views showing fabricating steps of the AM-LCD.

After the state of FIG. 3A was obtained in the manner described above, activation of the impurity element was carried out by combination of furnace annealing, laser annealing, lamp annealing, and the like. At the same time, damage of the active layers suffered at the adding step was also repaired.

Next, a first interlayer insulating film 49 was formed to a thickness of 500 nm. As the first interlayer insulating film 49, a silicon oxide film, a silicon nitride film, a silicon nitride oxide film, an organic resin film, or a laminate film of those may be used.

Incidentally, polyimide, acryl, polyamide, polyimidoamide, etc. may be used for the organic resin film. As merits of the organic resin film, it is possible to enumerate such points that a film formation method is simple, a film thickness can be easily made thick, parasitic capacitance can be reduced since relative dielectric constant is low, and flatness is superior.

Figure 3B:
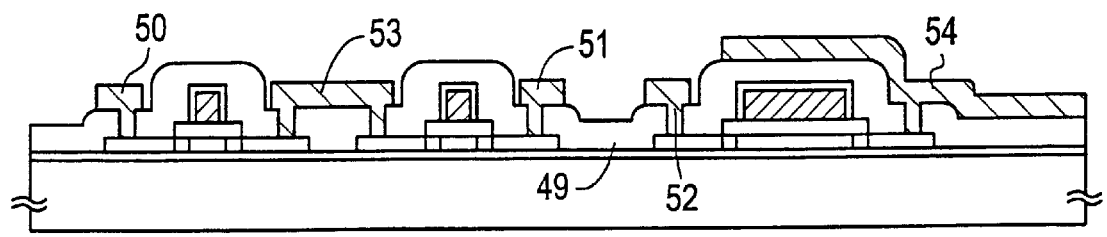

Next, after contact holes were formed, source wiring lines (including source electrodes) 50 to 52 and drain wiring lines (including drain electrodes) 53 and 54, which were made of a three-layer structure of an aluminum alloy film sandwiched between titanium films, were formed (FIG. 3B).

Next, a silicon nitride film 55 having a thickness of 50 nm was formed, and a second interlayer insulating film (in this embodiment, an acryl film) 56 having a thickness of 1 μm was formed thereon. The acryl film 56 was provided with an opening portion at a part, and a black mask 57 made of a titanium film was formed thereon. On the CMOS circuit, a wiring line 58 for leading was formed of the same material as the black mask 57.

At this time, in the pixel matrix circuit, the black mask 57 overlapped with the drain electrode 54 through the silicon nitride film 55. The structure of this embodiment has a feature that this portion is used as holding capacitance.

Next, a third interlayer insulating film (in this embodiment, an acryl film) 59 was formed to a thickness of 1 μm, a contact hole was bored, and a pixel electrode 60 made of a transparent conductive film (typically an ITO film) was formed. Finally, the whole substrate was heated in a hydrogen atmosphere of 350° C. for 1 to 2 hours to hydrogenate the whole device, so that dangling bonds (unpaired bonds) in the films (especially in the active layers) were terminated.

Figure 3C:
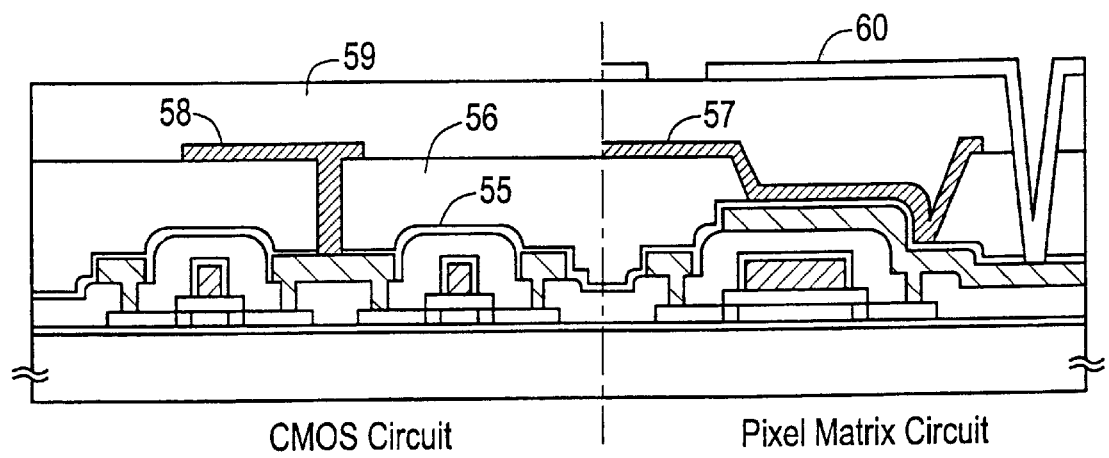

Through the foregoing steps, it was possible to fabricate the CMOS circuit and the pixel matrix circuit having the structure as shown in FIG. 3C. The substrate in which this state is completed is called an active matrix substrate. Although the pixel TFT is shown in a single gate structure, for the purpose of reducing an off current (a drain current flowing when a TFT is in an off state), it is preferable to make a multi-gate structure such as a double-gate structure or a triple-gate structure.

[Findings as to crystal structure of an active layer]

The semiconductor layer formed in accordance with the above fabricating steps has microscopically a crystal structure in which a plurality of needle-like or rod-like crystals (hereinafter abbreviated to "rod-like crystals") are collected and arranged. This can be easily ascertained by observation with a TEM (Transmission Electron Microscope).

It was ascertained by using electron beam diffraction and X-ray diffraction that in the surface of the semiconductor layer (portion where a channel was formed), an electron beam diffraction pattern indicated regularity peculiar to a {110} orientation although some deviation was included in crystal axes, and a main orientation plane was a {110} plane. As the result of applicant's detailed observations of a diffraction photograph of an electron beam with a spot diameter of about 1.5 μm, it was ascertained that diffraction spots corresponding to the {110} plane clearly appeared, and the respective spots had an extension on concentric circles. The extension is within ±2° (typically within ±1.5°, preferably within ±0.5°) with respect to a line connecting the center of the electron beam spot and the center of the diffraction spot.

It is known that such a distribution of diffraction spots appears when the respective crystal grains having the same crystal axis are collected in such an arrangement that they are rotated one another around the crystal axis. That is, when an angle between a specific axis (called an axis A) included in a certain crystal surface and an axis (called an axis B) equivalent to the axis A contained in an adjacent another crystal surface is called a rotation angle, a position where a diffraction spot appears is shifted by the amount corresponding to the rotation angle.

Thus, in the case where a plurality of crystal grains are collected in a positional relation where they have some rotation angle to one another, one electron beam diffraction pattern is observed as a collective of diffraction spots which the respective crystal grains show.

That is, it is meant that in the case where the diffraction spot has an extension within the range of ±2° (typically within ±1.5°, preferably within ±0.5°) like the semiconductor layer of this embodiment, the absolute value of the rotation angle made by equivalent axes between adjacent crystal grains is within 4° (typically within 3°, preferably within 1°).

Incidentally, in the case where a crystal axis is a <110> axis, a <111> axis can be named as an equivalent axis contained in the crystal surface. In the semiconductor layer of this embodiment, there are a number of crystal grains in which the <111> axes are in contact with each other with a rotation angle of 70.5° (or someone says that the angle is 70.4°). Also in this case, it can be said that the equivalent axis has a rotation angle of 70.5°±2°.

That is, it can also be said that in the semiconductor layer of this embodiment, the absolute value of a rotation angle of an equivalent axis or an axis in a rotational relation of 70.5° to the equivalent axis is within 4° (typically within 3°, preferably within 1°) between adjacent crystal grains.

The present applicant observed crystal grain boundaries formed through contact of individual rod-like crystals by means of HR-TEM (High Resolution Transmission Electron Microscope), and ascertained that 90% or more of crystal lattices have continuity at the crystal grain boundaries. This was capable of being easily ascertained since the observed lattice stripes were continuously connected at the crystal grain boundaries.

Incidentally, the continuity of the crystal lattice at the crystal grain boundary is caused from the fact that the crystal grain boundary is a grain boundary called a "planar boundary". The definition of the planar boundary in the present specification is "Planar boundary" disclosed in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751–758, 1988".

According to the above paper, the planar boundary includes a twin boundary, a specific laminate defect, a specific twist boundary, and the like. This planar boundary has a feature that it is electrically inactive. That is, since the planar boundary does not function as a trap to block the movement of a carrier though it is a crystal grain boundary, it can be regarded as not substantially existing.

Particularly in the case where a crystal axis (axis vertical to a crystal plane) is a <110> axis, a {211} twin boundary is called also a coincidence boundary of $\Sigma 3$. The $\Sigma$ value is a parameter which becomes an index showing the degree of conformity of the coincidence boundary, and it is known that as the value becomes small, the conformity of the grain boundary becomes excellent.

As the result of applicant's detailed observations of a semiconductor layer obtained through the fabricating steps of this embodiment by means of the TEM, it was found that almost all (90% or more, typically 95% or more) crystal grain boundaries are coincidence boundaries of $\Sigma 3$, that is, {211} twin boundaries. From this fact, the present applicant judges that 90% or more of crystal lattices have continuity at the crystal grain boundaries.

At the crystal grain boundary formed between two crystal grains, and in the case where both crystals have a plane orientation of {110}, when an angle formed by lattice stripes corresponding to a {111} plane is θ, it is known that when θ=70.5°, the boundary becomes a coincidence boundary of $\Sigma 3$.

In the semiconductor layer of this embodiment, the respective lattice stripes of crystal grains adjacent at the crystal grain boundary are continuous at just about 70.5°, and from this, it is concluded that this crystal grain boundary is the {211} twin boundary.

Although a boundary becomes a coincidence boundary of $\Sigma 9$ when θ=38.9°, such other crystal grain boundaries also existed.

Such a coincidence boundary is formed only between crystal grain boundaries of the same plane orientation. That is, since the semiconductor layer obtained by carrying out this embodiment has substantially the uniform plane orientation of {110}, such a coincidence boundary can be formed over a wide range.

Such a crystal structure (correctly, structure of a crystal grain boundary) shows that two different crystal grains are connected to each other with extremely superior conformity at the crystal grain boundary. That is, such a structure is formed that crystal lattices are continuously connected at the crystal grain boundary and it is very hard to form a trap level due to a crystal defect etc. Thus, a crystalline semiconductor thin film with such a crystal structure can be regarded as substantially having no crystal grain boundary.

Besides, it is ascertained by TEM observation that defects existing in crystal grains almost disappear by a heat treatment step at a temperature of 700 to 1150° C. This is obvious also from the fact that the number of defects is greatly decreased about the time of this heat treatment step.

The difference in the number of defects appears as difference in spin density by electron spin resonance (ESR). Under the present circumstances, it is found that the spin density of a crystalline silicon film fabricated in accordance with the fabricating steps of the embodiment 1 is $5 \times 10^{17}$ spins/cm$^3$ or less (preferably $3 \times 10^{17}$ spins/cm$^3$ or less). However, since this measured value approximates the detection limit of an existing measuring apparatus, it is expected that an actual spin density is further low.

If this heat treatment step is carried out in a reducing atmosphere, especially in a hydrogen atmosphere, the slight remaining defects are also terminated with hydrogen and are made inactive. By doing so, it is possible to regard that defects in crystal grains do not substantially exist.

From the above, since the semiconductor layer obtained by carrying out the present invention does not substantially include crystal grains and crystal grain boundaries, the layer can be considered as a single crystal semiconductor thin film or substantially a single crystal semiconductor thin film. The present applicant refers to the semiconductor layer having such a crystal structure and features as continuous grain boundary crystal silicon (Continuous Grain Silicon: CGS). The active layer (especially the channel formation region) of a TFT used in the present invention is formed of a semiconductor layer having the crystal structure and features as described above.

[Findings as to electrical characteristics of a TFT]

A TFT fabricated in this embodiment exhibits electrical characteristics comparable to a MOSFET using a single crystal silicon wafer. Data as shown below have been obtained from TFTs experimentally formed by the present applicant. It is needless to say that a TFT used in the present invention exhibits the following electrical characteristics.

Figure 12A:
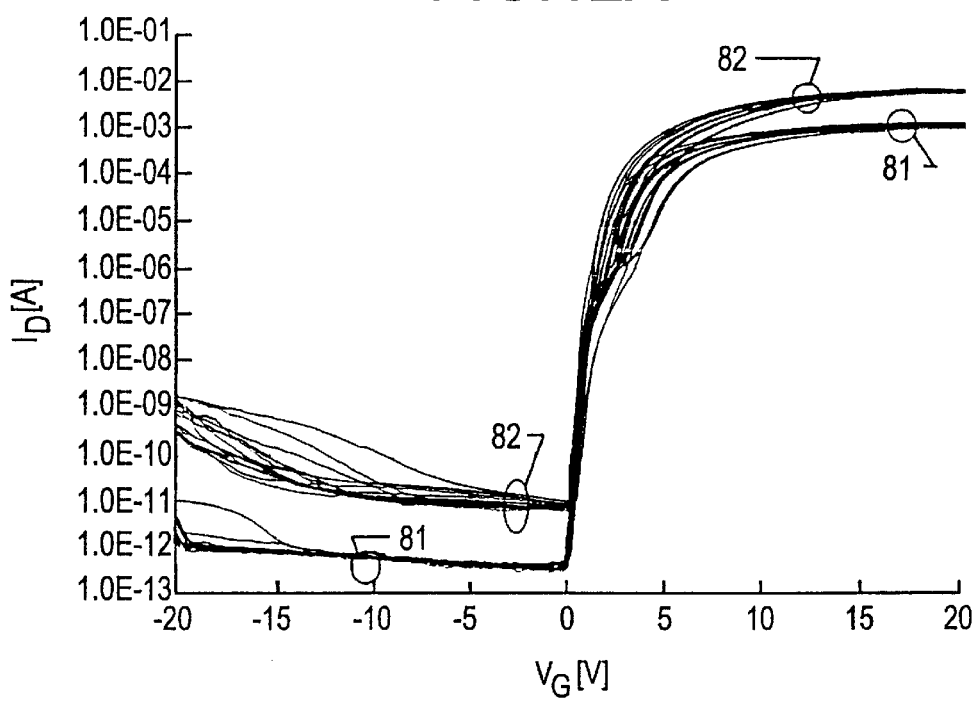
FIGS. 12A and 12B are views showing current-voltage characteristics of TFTs.
Figure 12B:
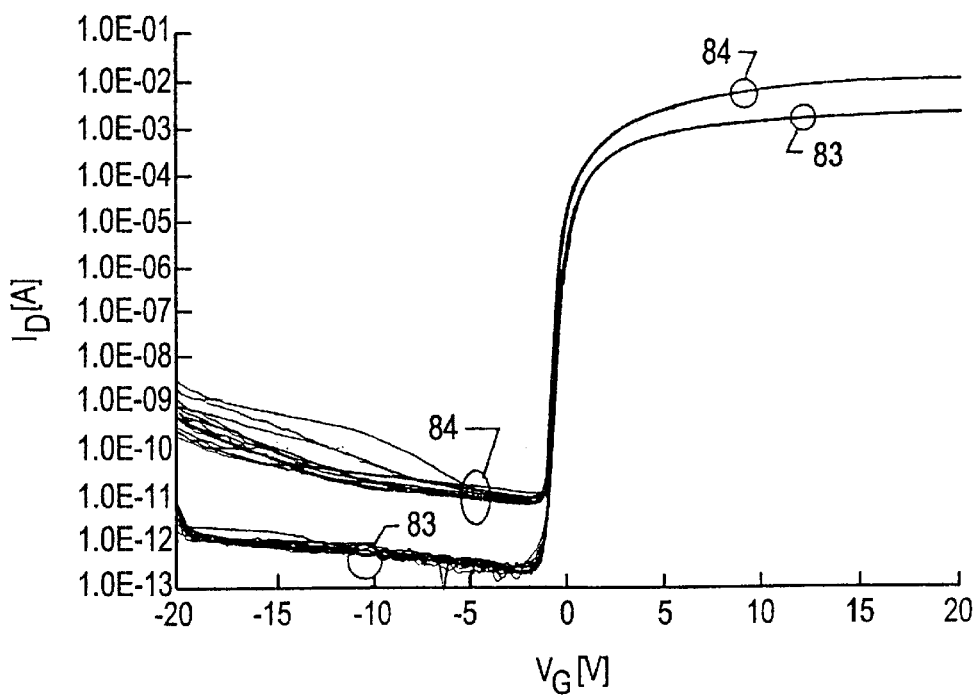

FIGS. 12A and 12B show curves obtained by plotting gate voltages (VG) in the horizontal axis and drain currents (ID) in a log scale in the vertical axis, and are graphs generally called current-voltage characteristics.

The present applicant used an apparatus of model No. 4155A of Hewlett-Packard Co. as a measuring apparatus, and the current-voltage characteristics were measured. Measurement was made under the condition that the source voltage was fixed at 0 V, and the drain voltage was made to have two values of 1 V and 11 V. Besides, the measurement was made under the condition that the gate voltage was changed in the range of −20 to 20 V. In FIGS. 12A and 12B, measurement results of 16 typical points are together expressed in the same graph.

FIG. 12A shows the result of measurement for the case where the step of forming the base film is removed from the process described in the embodiment 1. That is, the drawing shows data in the case where the amorphous silicon film is directly formed on the quartz substrate. Besides, FIG. 12B shows the result of measurement for the TFT fabricated through the process described in the embodiment 1. In both cases, the film thickness of the amorphous silicon film was made 90 nm.

In FIG. 12A, reference numeral 81 indicates measurement results in which drain voltage is 1V, and 82 indicates measurement results in which drain voltage is 11 V. Since the film thickness of the amorphous silicon film is as thick as 90 nm, crystallization does not proceed well, and drain currents at an on side fluctuate though the TFTs are formed on the same substrate.

Incidentally, the drain current at the on side means a drain current at the time when the gate voltage is 0 V or more (when the TFT is in an on on state). Such a drain current is hereinafter referred to as an on current. On the contrary, a drain current at the time when the drain current is at an off side (when the gate voltage is 0 V or less, that is, the TFT is in an off state) is referred to as an off current.

Thus, it is understood that in the current-voltage characteristics shown in FIG. 12A, both the on current and the off current fluctuate.

However, in spite of the same condition that the amorphous silicon film has a thickness of 90 nm, the fluctuation as seen in FIG. 12A is hardly seen in the current-voltage characteristics shown in FIG. 12B. In FIG. 12B, reference numeral 83 indicates measurement results when the drain voltage is 1 V, and 84 indicates measurement results when the drain voltage is 11 V.

In the graph shown in FIG. 12B, although some fluctuation is seen in the off current, the on current hardly fluctuates. The difference in fabricating steps between the TFT in which the graph shown in FIG. 12A is obtained and the TFT in which the graph shown in FIG. 12B is obtained is only a point that the base film and the amorphous silicon film are continuously formed without exposing to the air. It has been found that such remarkable difference arises from only such difference.

The fluctuation in the on current as seen in the graph of FIG. 12A has an influence on fluctuation in values of threshold voltage (Vth) and subthreshold coefficient (S-value). FIGS. 13 shows summarization of its state.

Figures 1, 13A:
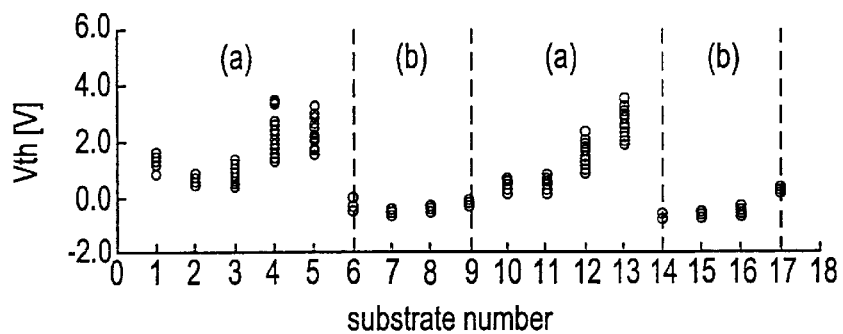
FIGS. 13A-1, 13A-2, 13B-1, and 13B-2 are views showing comparison of electric characteristics of TFTs.

In FIGS. 13A-1 to FIGS. 13B-2, (a) indicates a case with base film and (b) indicates a case without a base film. FIG. 13A-1 shows plotting of substrate numbers in the horizontal axis and threshold voltages of NTFTs in the vertical axis. The substrates of substrate numbers 1 to 5 and 10 to 13 are fabricated under the same condition, and have the structure (corresponding to the TFT in which the data of FIG. 12A were obtained) where the active layer is directly formed on the quartz substrate. The substrates of substrate numbers 6 to 9 and 14 to 17 are fabricated under the same condition and have the structure (corresponding to the TFT in which the data of FIG. 12B were obtained) where the base film and the amorphous semiconductor film are continuously formed on the quartz substrate and the active layer is formed. Here, the data are obtained when the drain voltage is 11 V.

With respect to the substrate numbers 2 to 5, the film thicknesses of the active layers are 60 nm, 67 nm, 90 nm, and 105 nm in the ascending order of the numbers. This conditioning is common to the substrate numbers 6 to 9, the substrate numbers 10 to 13, and the substrate numbers 14 to 17, and is common to all of FIGS. 13A-1, 13A-2, 13B-1, and 13B-2.

From FIG. 13A-1, it is clearly understood that the fluctuation in the threshold voltage can be suppressed when the base film is provided. However, since boron pollution at the interface between the base film and the active layer cannot be prevented by simply providing the base film, it is important that the base film and the semiconductor film are continuously formed without exposing to the air.

When calculation was made on the basis of data of FIG. 13A-1, a standard deviation (σ) of threshold voltages of NTFTs fabricated through the fabricating steps of the embodiment 1 was 0.1 V or less (typically 0.05 V or less).

Figures 2, 13A:
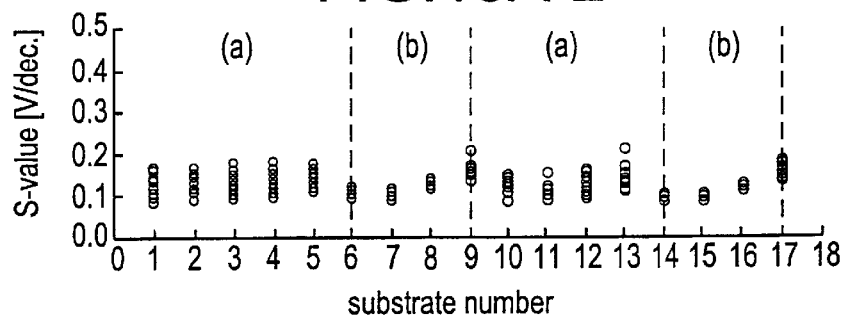

Next, FIG. 13A-2 shows plotting of substrate numbers in the horizontal axis and subthreshold coefficients (also called S-values or S values) of NTFTs in the vertical axis. Also from this drawing, it is understood that the fluctuation in the subthreshold coefficient is greatly suppressed by using the fabricating steps of the embodiment 1. When calculation was made on the basis of the data of FIG. 13A-2, a standard deviation (σ) of the subthreshold voltages of NTFTs fabricated through the fabricating steps of the embodiment 1 was 10 mV or less (typically 7 mV or less). Here, the data are obtained when the drain voltage is 1 V.

Figures 1, 13B:
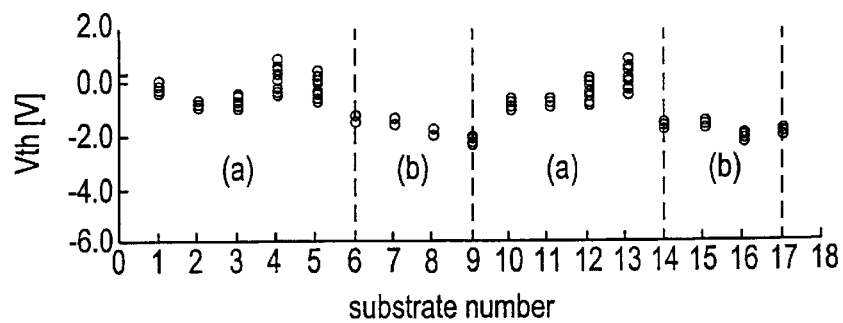
Figures 2, 13B:
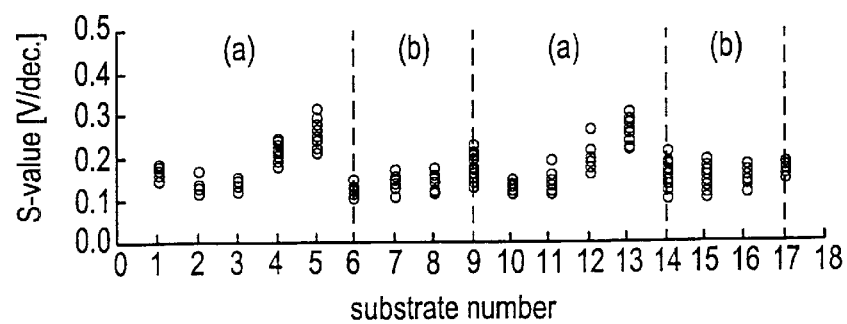

Next, FIG. 13B-1 shows plotting of substrate numbers in the horizontal axis and threshold voltages of PTFTs in the vertical axis. It is understood that in the case of the PTFT as well, the fluctuation in the threshold voltage is greatly suppressed by using the fabricating steps of the embodiment 1.

When calculation was made on the basis of the data of FIG. 13B-1, a standard deviation (σ) of the threshold voltages of PTFTs fabricated through the fabricating steps of the embodiment 1 was 0.1 V or less (typically 0.07 V or less). Here, the data are obtained when the drain voltage is −11 V.

Next, FIG. 13B-2 shows plotting of substrate numbers in the horizontal axis and subthreshold coefficients of PTFTs in the vertical axis. When calculation was made on the basis of the data of FIG. 13B-2, a standard deviation (σ) of the subthreshoLd coefficients of PTFTs fabricated through the fabricating steps of the embodiment 1 was 20 mV or less (typically 18 mV or less). Here, the data are obtained when the drain voltage is −11 V.

Figure 14:
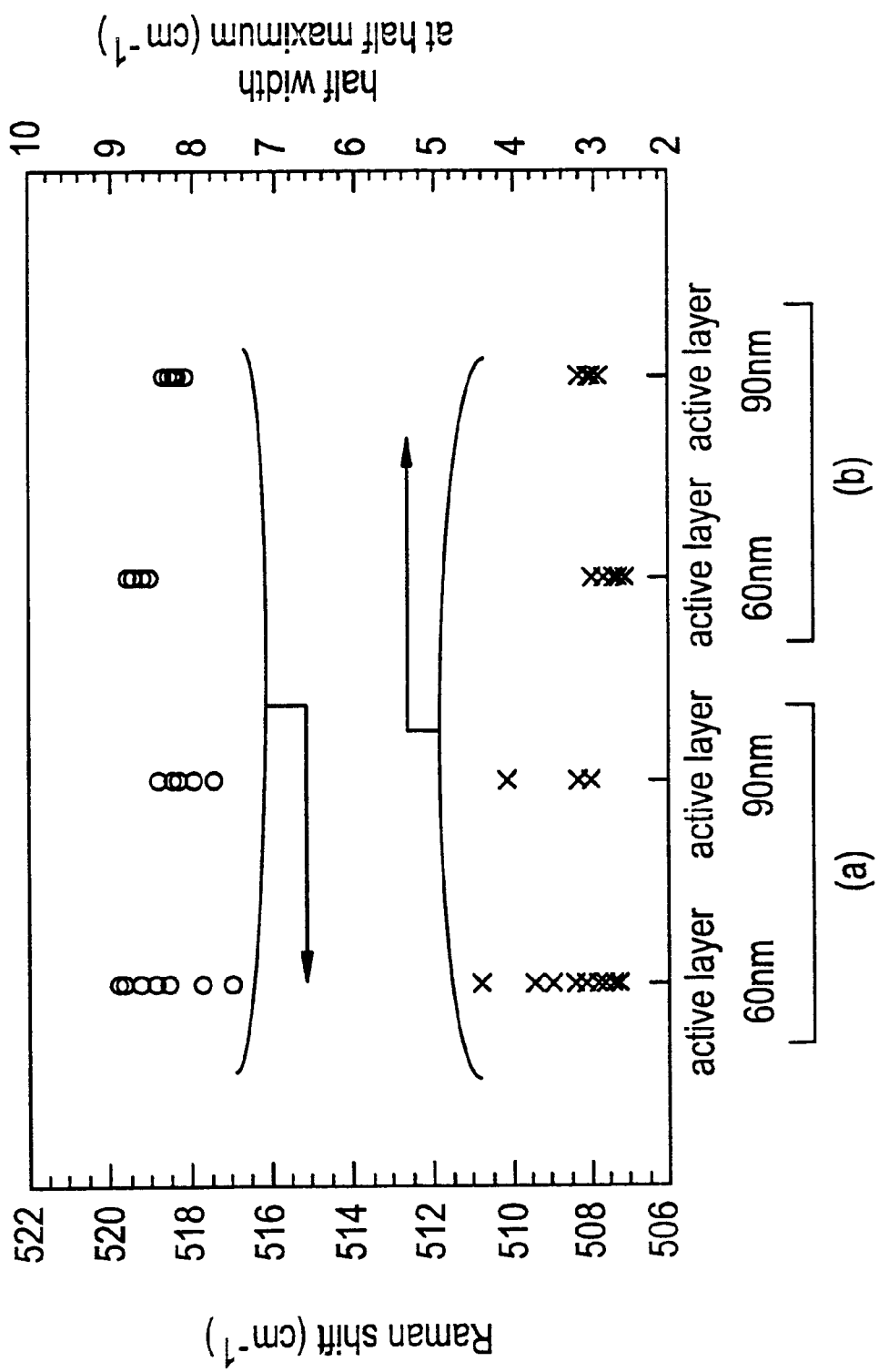
FIG. 14 is a view showing comparison of crystallinity of semiconductor films.

FIG. 14 shows examination results of the structure using the present invention and the structure not using the present invention from the viewpoint of crystallinity of a semiconductor film. FIG. 14 shows comparison between a case (a) (without a base film) where a base film is not formed on a substrate and a case (b) (with a base film) where a base film is formed on a substrate. The horizontal axis indicates a fabricating condition, the vertical axis at the left side indicates a Raman shift ($cm^{-1}$), and the vertical axis at the right side indicates a half width at half maximum ($cm^{-1}$). The half width at half maximum is a half value of a half width.

When comparison is made between active layers having the same film thickness, it is understood that the fluctuation is obviously reduced. Like this, the present invention was also able to suppress the fluctuation in parameters as indices of crystallinity of a semiconductor film, such as a Raman shift and a half width at half maximum.

As described above, by adopting the structure that the base film and the semiconductor film are continuously formed on the quartz substrate without exposing to the air as described in the embodiment 1, it was possible to greatly improve electrical characteristics such as the threshold voltage and subthreshold coefficient.

Particularly, since a TFT using a semiconductor film called CGS by the present applicant exhibits extremely excellent electrical characteristics, it is very sensible to fluctuation. Thus, it has been found that the structure in which the present invention is combined with such a semiconductor film produces the synergistic effect to make the best use of mutual merits.

[Embodiment 2]

Although the example where the silicon film is used as the semiconductor film has been described in the embodiment 1, it is also effective to use a silicon film containing 1 to 10% of germanium as expressed by $Si_XGe_{1-X}$ ($0<X<1$, preferably $0.9 \leq X \leq 0.99$).

In the case where such a compound semiconductor film is used, a threshold voltage can be made small when an N-type TFT and a P-type TFT are fabricated. Besides, a field effect mobility (called mobility) can be made large.

[Embodiment 3]

In the embodiment 1, since an impurity is not intentionally added into an active layer, a channel formation region becomes intrinsic or substantially intrinsic. Incidentally, the term "substantially intrinsic" means to satisfy either one of the following: activation energy of a semiconductor layer is almost ½ (Fermi level is positioned almost at the center of a forbidden band); an impurity concentration is lower than a spin density; and an impurity is not intentionally added.

However, in the present invention, by using a well-known channel doping technique, it is also possible to control a threshold voltage of a TFT and also to prevent the so-called punchthrough. In the present invention, since the threshold voltage is originally very small, the concentration of impurity addition may be very small. That the concentration of addition may be very small is extremely preferable since control of threshold voltage becomes possible without lowering the mobility of a carrier.

The structure of this embodiment is the same also in the case where the embodiment 2 is combined with the embodiment 1.

[Embodiment 4]

Figure 4:
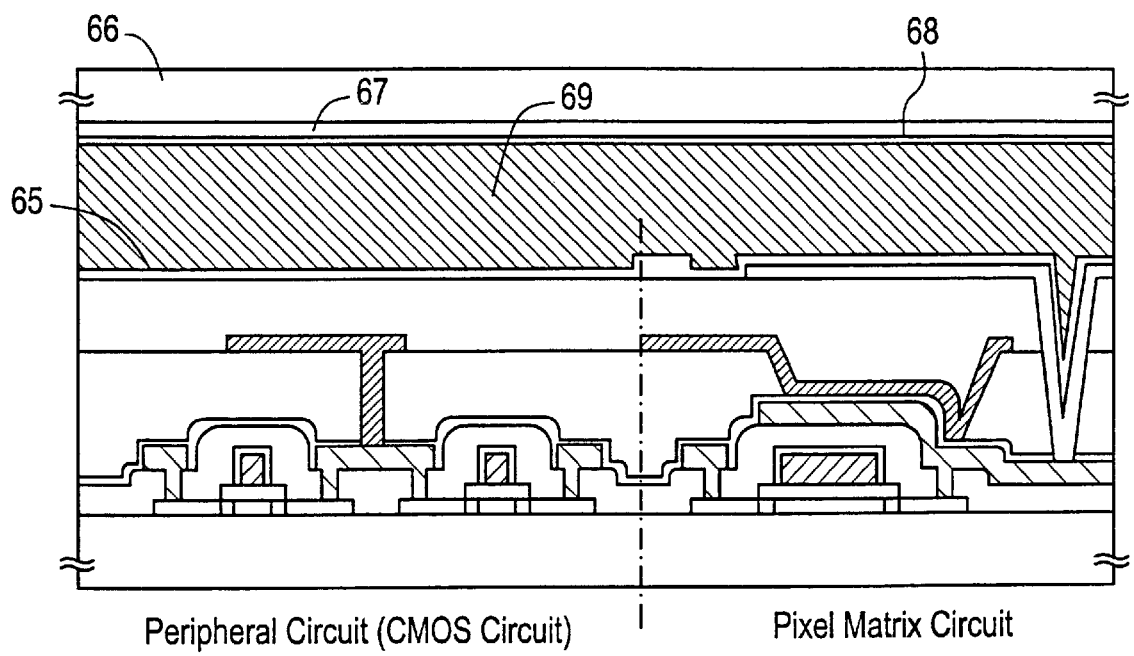
FIG. 4 is a view showing a sectional structure of the AM-LCD.

In this embodiment, a description will be made on an example in which a liquid crystal panel is constructed by using the present invention. FIG. 4 is a view schematically showing a section of an AM-LCD, and shows a CMOS circuit in a region where a driver circuit or a logic circuit is constructed, and a pixel TFT in a region where a pixel matrix circuit is constructed.

Since the description with respect to the structure (TFT structure) of the CMOS circuit and the pixel matrix circuit has been made in the embodiment 1, only necessary portions will be described in this embodiment.

First, the state of FIG. 3C is obtained in accordance with the fabricating steps described in the embodiment 1. An operator may freely make such modifications as to make a pixel TFT a multi-gate structure.

Then an alignment layer 65 is formed in preparation of an active matrix substrate. Next, a counter substrate is prepared. The counter substrate is constituted by a glass substrate 66, a transparent conductive film 67, and an alignment layer 68. Although a black mask and a color filter are formed at the side of the counter substrate as the need arises, they are omitted here.

The active matrix substrate and the counter substrate prepared in this way are bonded to each other by a well-known cell assembling step. A liquid crystal material 69 is filled between both the substrates so that an AM-LCD as shown in FIG. 4 is completed.

The liquid crystal material 69 may be freely selected according to an operation mode (ECB mode, guest host mode, etc.) of the liquid crystal.

Figure 5:
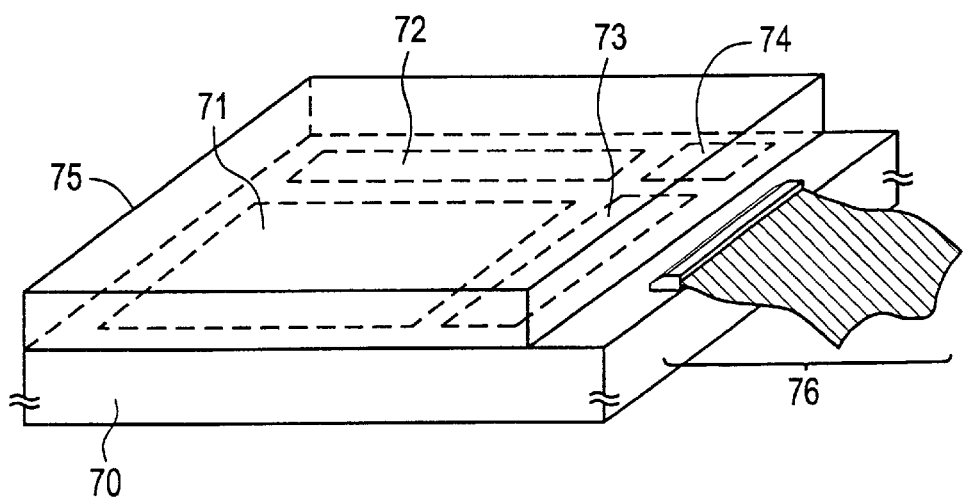
FIG. 5 is a view showing an outer appearance of the AM-LCD.

FIG. 5 is a view schematically showing an outer appearance of an AM-LCD as shown in FIG. 4. Reference numeral 70 designate an active matrix substrate on which a pixel matrix circuit 71, a source driver circuit 72, a gate driver circuit 73, and a signal processing circuit 74 are formed. Reference numeral 75 designates a counter substrate.

The signal processing circuit 74 indicates a memory circuit, a D/A (or A/D) converter circuit, a pulse generator circuit, a signal dividing circuit, a γ-correction circuit, etc., which process various kinds of signals necessary for performing image display.

An FPC (Flexible Print Circuit) terminal 76 as an external terminal is attached to the thus formed liquid crystal panel. In general, what is called a liquid crystal module is a liquid crystal panel in the state where the FPC is attached.

The structure of this embodiment may be freely combined with any of the embodiments 1 to 3.

[Embodiment 5]

In this embodiment, a description will be made on an example in which a plurality of CMOS circuits each having a structure different from that of the embodiment 1 are fabricated on the same substrate. FIGS. 6A to 6E and 7A to 7D are used for the description.

Figure 6A:
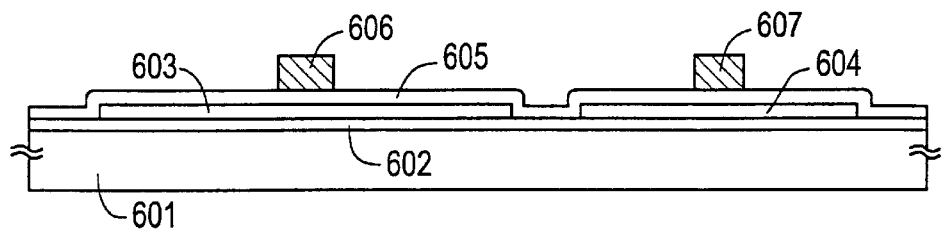
FIGS. 6A to 6E are views showing fabricating steps of the AM-LCD.

First, steps up to the step of FIG. 2A were carried out in accordance with the fabricating steps of the embodiment 1, so that the state of FIG. 6A was obtained. In FIG. 6A, reference numeral 601 designates a quartz substrate; 602, a base film of a laminate of a silicon nitride film and a silicon oxide film; 603, an active layer of an NTFT; and 604, an active layer for a PTFT.

Also in this embodiment, the base film 602 and an amorphous semiconductor film thereon were formed without exposing to the air. Thus, it is possible to say that air pollution (especially pollution by boron) does not exist at the interface between the base film 602 and the active layer 603 (or the active layer 604). That is, as described in the embodiment 1, it was possible to fabricate a TFT having extremely less fluctuation in electrical characteristics.

In FIG. 6A, reference numeral 605 designates a gate insulating film made of a laminate of a silicon oxide film and a silicon nitride film, and gate wiring lines 606 and 607 are formed thereon. In this embodiment, as a material of a gate electrode, a laminate film in which a tantalum nitride film was laminated on a tantalum film was used.

After the state of FIG. 6A was obtained in this way, a first phosphorus doping step (adding step of phosphorus) was carried out. Here, in order to add phosphorus through the gate insulating film 605, an acceleration voltage was set as high as 80 keV. A dose amount was adjusted so that first impurity regions 608 and 609 formed in this way had a phosphorus concentration of $1\times10^{17}$ atoms/cm$^3$ and a length (width) of 0.5 μm. The phosphorus concentration at this time is expressed by (n−). Instead of phosphorus, arsenic may be used.

Figure 6B:
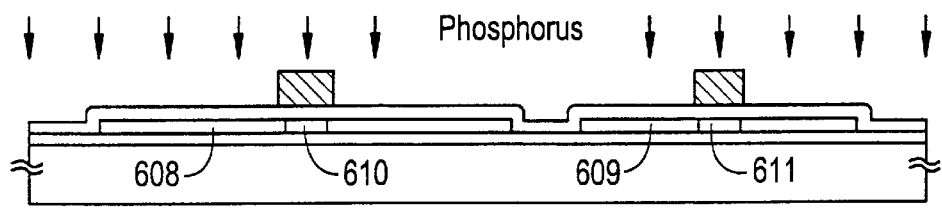

The first impurity regions 608 and 609 were formed in a self-aligned manner using the gate wiring lines 606 and 607 as masks. At this time, intrinsic or substantially intrinsic crystalline silicon layers remained just under the gate wiring lines 606 and 607, so that channel formation regions 610 and 611 were formed. However, since some phosphorus actually went around into the inside of the gate wiring line and was added, such a structure was made that the gate wiring lines 606 and 607 overlap with the first impurity regions 608 and 609 (FIG. 6B).

Next, an amorphous silicon layer having a thickness of 0.1 to 1 μm (typically 0.2 to 0.3 μm) was formed so as to cover the gate wiring lines 606 and 607, and anisotropic etching was carried out so that side walls 612 and 613 were formed. The width (thickness viewed from a side of the gate wiring line) of the side walls 612 and 613 was made 0.2 μm (FIG. 6C).

In this embodiment, since the layer in which any impurity was not added was used as the amorphous silicon layer, the side walls made of intrinsic silicon layers were formed.

Figure 6C:
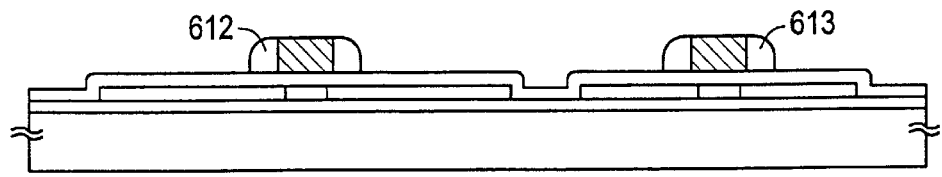

After the state of FIG. 6C was obtained, a second phosphorus doping step was carried out. Also in this case, an acceleration voltage was made 80 keV similarly to the first case. A dose amount was adjusted such that second impurity regions 614 and 615 formed at this time contained phosphorus at a concentration of $1\times10^{18}$ atoms/cm$^3$. The phosphorus concentration at this time is expressed by (n).

Figure 6D:
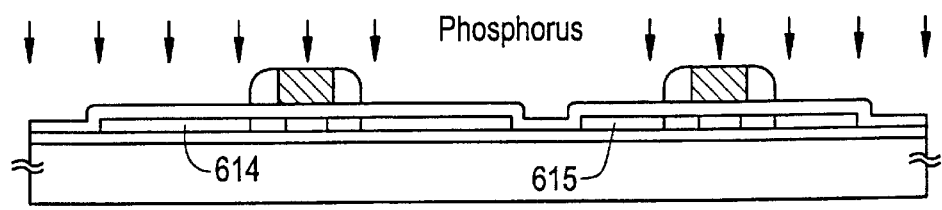

In the phosphorus doping step shown in FIG. 6D, the first impurity regions 608 and 609 remain only just under the side walls 612 and 613. The first impurity regions 608 and 609 come to function as first LDD regions overlapping with gate electrodes. The present applicant refers to such an LDD region as a GOLD (Gate-drain OverLapped LDD) region.

Besides, in the step of FIG. 6D, phosphorus was added also in the side walls 612 and 613. Since the acceleration voltage was high, phosphorus was actually distributed in such a state that the tail (bottom) of a concentration profile of phosphorus extends in the inside of the side wall. Although a resistance component of the side wall can be adjusted by this phosphorus, if the concentration distribution of phosphorus extremely fluctuates, such a state can be caused that a gate voltage applied to the second impurity region 614 changes for every element. Thus, precise control is necessary at the time of doping.

Next, a resist mask 616 covering a part of the NTFT and a resist mask 617 covering all the PTFT were formed. The gate insulating film 605 was subjected to dry etching in this state so that a processed gate insulating film 618 was formed (FIG. 6E).

At this time, the length of a portion of the gate insulating film 618 projecting toward the outside of the side wall 612 (length of a portion of the gate insulating film 618 which was in contact with the second impurity region 614) determined the final length (width) of the second impurity region. Thus, it was necessary to accurately carry out masking of the resist mask 616.

Figure 6E:
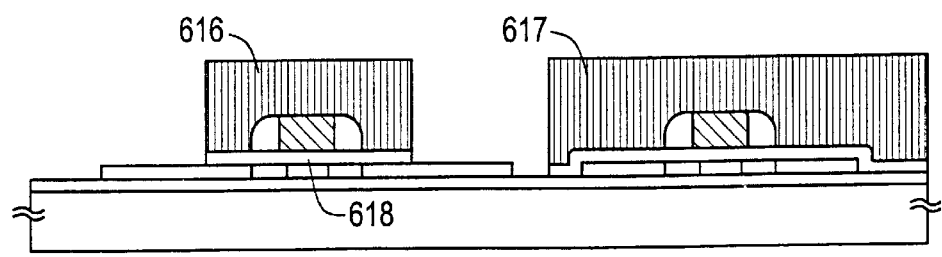
Figure 7A:
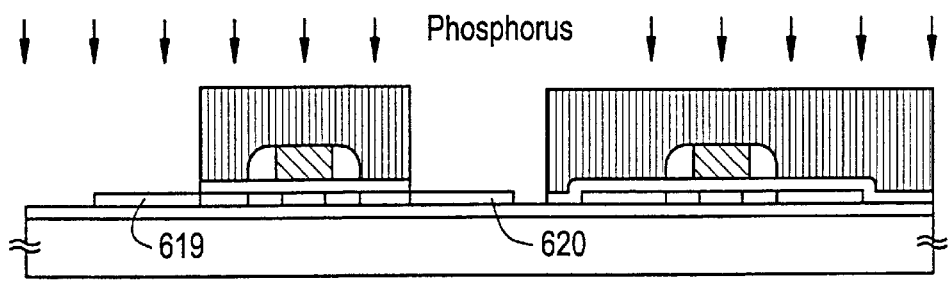
FIGS. 7A to 7D are views showing fabricating steps of the AM-LCD.

After the state of FIG. 6E was obtained, a third phosphorus doping step was carried out. Since phosphorus was added into an exposed active layer at this time, an acceleration voltage was set as low as 10 keV. A dose amount was adjusted such that third impurity regions 619 and 620 formed in this way contained phosphorus at a concentration of $5\times10^{20}$ atoms/cm$^3$. The phosphorus concentration at this time is expressed by (n+) (FIG. 7A).

Since phosphorus is not added in a portion shielded with the resist mask 616, the second impurity region 614 remains at the portion as it is. The second impurity region 614 functions as a second LDD region which does not overlie (does not overlap with) the gate electrode, the third impurity region 619 comes to function as a source region, and the third impurity region 620 comes to function as a drain region.

Next, the resist masks 616 and 617 were removed, and a resist mask 621 covering all the NTFT was newly formed. Then the side wall 613 of the PTFT was first removed, and further, the gate insulating film 605 was subjected to dry etching so that a gate insulating film 622 having the same shape as the gate wiring line 607 was formed (FIG. 7B).

Figure 7B:
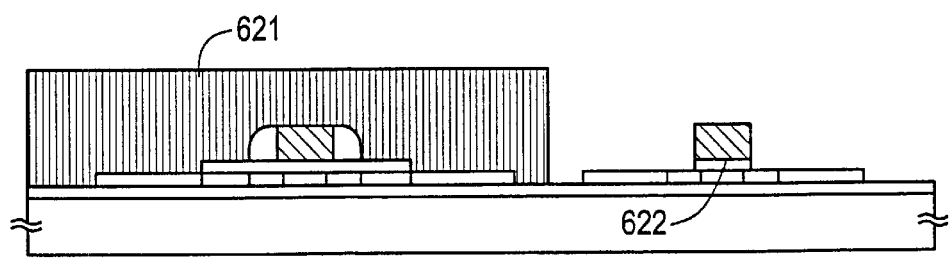

After the state of FIG. 7B was obtained, a boron doping step (adding step of boron) was carried out. Here, an acceleration voltage was made 10 keV, and a dose amount was adjusted such that fourth impurity regions 623 and 624 contained boron at a concentration of $3\times10^{20}$ atoms/cm$^3$. The boron concentration at this time is expressed by (p++) (FIG. 7C).

At this time, since boron also went around into the inside of the gate wiring line 607 and was added, the channel formation region 611 was formed inside of the gate wiring line 607. In this step, the first impurity region 609 and the second impurity region 615 formed at the PTFT side are inverted by boron into a P type. Thus, although a resistance value is changed between the portion which was originally the first impurity region and the portion which was the second impurity region, since boron is added at a sufficiently high concentration, a problem does not occur.

The fourth impurity regions 623 and 624 are formed using the gate wiring line 607 as a mask completely in a self-aligned manner, the region 632 functions as a drain region, and the region 624 functions as a source region. In this embodiment, although neither an LDD region nor an offset region is not formed for the PTFT, since the PTFT has originally high reliability, there is no problem. Rather, since a larger on current can be secured when the LDD region etc. is not provided, there is also an advantageous case.

Figure 7C:
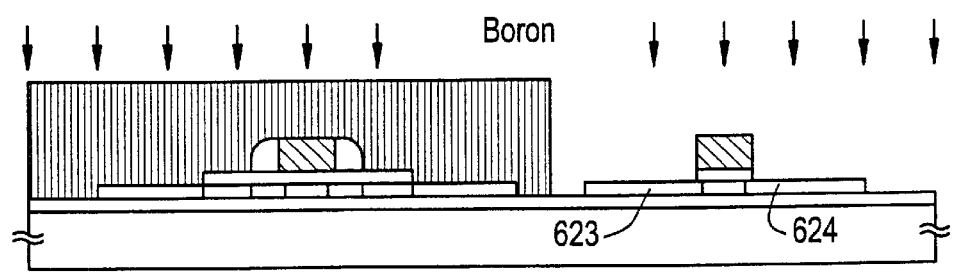

In this way, as shown in FIG. 7C, the channel formation region, the first impurity region, the second impurity region, and the third impurity region are finally formed in the active layer of the NTFT, and only the channel formation region and the fourth impurity region are formed in the active layer of the PTFT. Roles of the respective impurity regions will be described later.

After the state of FIG. 7C was obtained in this way, a first interlayer insulating film 625 having a thickness of 1 μm was formed. A silicon oxide film, a silicon nitride film, a silicon nitride oxide film, an organic resin film, or a laminate film of those may be used as the first interlayer insulating film 625. In this embodiment, an acryl resin film was adopted.

After the first interlayer insulating film 625 was formed, source wiring lines 626 and 627 and a drain wiring line 628, which were made of metal material, were formed. This embodiment employed a three-layer wiring line having such a structure that an aluminum film containing titanium was sandwiched between titanium films.

In the case where a resin film called BCB (benzocyclobutene) is used as the first interlayer insulating film 625, the flatness is increased, and at the same time, it becomes possible to use copper as a wiring material. Since copper has low wiring resistance, it is very effective as a wiring material.

After the source wiring lines and the drain wiring line were formed in this way, a silicon nitride film 629 having a thickness of 50 nm was formed as a passivation film. Further, a second interlayer insulating film 630 was formed thereon as a protective film. As the second interlayer insulating film 630, it is possible to use a material similar to the first interlayer insulating film 625. This embodiment adopted such a structure that an acryl resin film was laminated on a silicon oxide film having a thickness of 50 nm.

Figure 7D:
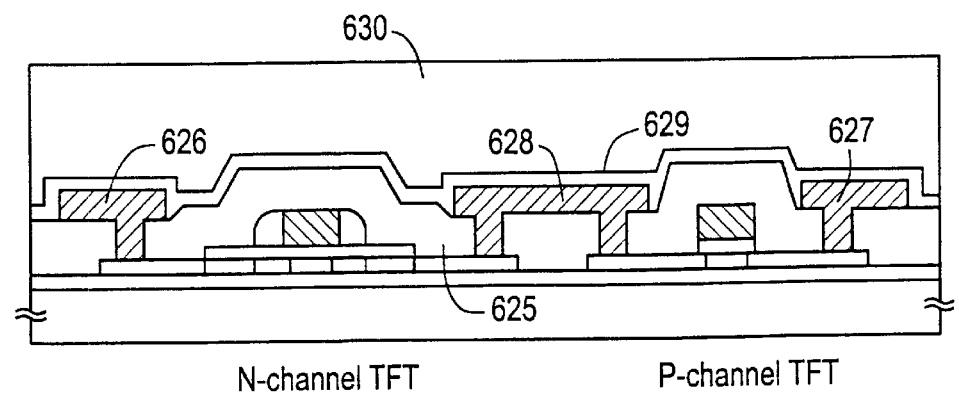

Through the steps as described above, the CMOS circuit having the structure as shown in FIG. 7D was completed. In the CMOS circuit formed in this embodiment, since the NTFT had superior reliability, the reliability of the circuit was greatly improved as a whole. Besides, it has been found that when the structure as in this embodiment is adopted, since characteristic balance (balance of electrical characteristic) between the NTFT and the PTFT becomes excellent, bad operation becomes hard to cause.

However, the structure described in this embodiment is merely an example, and the present invention is not necessarily limited to the structure shown in FIGS. 6A to 6E and FIGS. 7A to 7D. The important point of the present invention is the structure of the active layer of the NTFT, and the effect of the invention can be obtained if that point is not broken.

[Feature of an NTFT of this embodiment]

The feature of the NTFT of this embodiment will be described with reference to FIG. 8. Reference numeral 800 designates a quartz substrate, and 801 designates a base film. It is needless to say that a semiconductor film formed thereon is continuously formed without exposing to the air.

The feature of the NTFT is the structure of an active layer. The active layer of the NTFT of this embodiment includes a channel formation region 802, a pair of first impurity regions 803, a pair of second impurity regions 804, and a pair of third impurity regions 805. An impurity added in the respective impurity regions is an element in group 15 (typically phosphorus or arsenic).

At this time, the channel formation region 802 is made of an intrinsic semiconductor film or a semiconductor film added with boron at a concentration of $1\times10^{16}$ to $5\times10^{18}$ atoms/cm$^3$. Boron is an impurity for control of threshold voltage and prevention of punchthrough, and another element may be substituted as long as the same effect can be obtained. Also in that case, the element is added at a like concentration.

As the semiconductor film capable of being used as the active layer, it is possible to use not only a semiconductor film containing silicon as its main ingredient, such as a film of silicon, germanium, or silicon germanium but also a compound semiconductor film such as a film of gallium arsenic. Besides, the structure of this embodiment can also be applied to both a TFT using an amorphous semiconductor for an active layer and a TFT using a polycrystal (poly) semiconductor for an active layer.

The first impurity region 803 has a length of 0.1 to 3.5 μm (typically 1.5 to 2.5 μm) and an impurity concentration of $1\times10^{15}$ to $1\times10^{17}$ atoms/cm$^3$ (typically $5\times10^{15}$ to $5\times10^{16}$ atoms/cm$^3$, preferably $1\times10^{16}$ to $2\times10^{16}$ atoms/cm$^3$).

The second impurity region 804 has a length of 0.5 to 3.5 μm (typically 1.5 to 2.5 μm), and an impurity concentration of $1\times10^{16}$ to $1\times10^{19}$ atoms/cm$^3$ (typically $1\times10^{17}$ to $5\times10^{18}$ atoms/cm$^3$, preferably $5\times10^{17}$ to $1\times10^{18}$ atoms/cm$^3$). It is appropriate to make an adjustment such that the impurity concentration of the second impurity region becomes 5 to 10 times as high as the impurity concentration of the first impurity region.

Each of the third impurity regions 805 and 806 has a length of 2 to 20 μm (typically 3 to 10 μm) and an impurity concentration of $1\times10^{19}$ to $1\times10^{21}$ atoms/cm$^3$ (typically $1\times10^{20}$ to $5\times10^{20}$ atoms/cm$^3$). The third impurity regions 805 and 806 become a source region (805) or a drain region (806) for electrical connection to a source wiring line or a drain wiring line.

The impurity concentration of the first impurity region 803 may be different from or the same as that of the second impurity region 804.

As described above, the active layer of the NTFT of the present invention is characterized by comprising the three impurity regions having at least two (typically three) different impurity concentrations in addition to the channel formation region. By doing so, it is possible to realize such a structure that as a region distances from the channel formation region 802 like the first impurity region 803, the second impurity region 804, and the third impurity region 805 (or 806) (as a distance from the channel formation region becomes large), its impurity concentration gradually becomes high.

The intention of the present applicant is to realize a concentration gradient in an LDD region by intentionally forming a plurality of impurity regions. Thus, three or more impurity regions may exist.

A gate insulating film 807 is formed on the active layer formed in this way. In the case of FIG. 8, the gate insulating film 807 is formed in such a state that it overlaps with the second impurity region 804. This is a structure in the process when the second impurity region 804 is formed, and also becomes a feature in the case where the present invention is carried out. In other words, the gate insulating film 807 is provided to be in contact with the channel formation region 802, the first impurity region 803, and the second impurity region 804.

A gate wiring line 808 is provided on the gate insulating film 807. As a material of the gate wiring line 808, a single metal layer of tantalum (Ta), tantalum nitride (TaN), titanium (Ti), chromium (Cr), tungsten (W), molybdenum (Mo), silicon (Si), aluminum (Al), copper (Cu), or the like, or an alloy layer of these may be used.

In addition to the above, a laminate structure of different kinds of metal layers (specifically, a laminate structure of Ta/Al or a laminate structure of Ta/Ti) may be adopted, or a structure provided with metal silicide (specifically, a structure of combination of silicon and metal silicide such as Si/WSix, Si/TiSix, and Si/CoSix) may be adopted. However, in the case where silicon is used for a part of the gate wiring line, it is desirable to previously form a silicon oxide film on the silicon surface by thermal oxidation, plasma oxidation, or the like. Otherwise, there is a fear that the gate wiring line is also etched in a later step of removing a side wall.

A side wall 809 is provided on a side (side portion) of the gate wiring line 808. In the present invention, a layer containing silicon as its main ingredient (specifically, a silicon layer or a silicon germanium layer) is used as the side wall 809. It is desirable to use especially an intrinsic silicon layer. Of course, any of amorphous, crystalline, and microcrystalline layers may be used.

The present invention is devised to have such a structure that the side wall 809 overlaps with the first impurity region 803 (the first impurity region 803 and the side wall 809 are overlapped with each other through the insulating film 807). By making such a structure, it is possible to obtain merits as in the GOLD structure or LATID structure of a MOSFET.

In order to realize such a structure, it is necessary that a voltage is applied to the first impurity region 803 through the side wall 809. When the side wall is formed of an intrinsic silicon layer, since a leak current is also generated though a resistance value is high, there is a merit that capacitance is not formed at the side wall portion. That is, it is possible to prevent formation of storage capacitance with the side wall as a dielectric when a gate voltage is turned off.

In the case of a TFT, since the film thickness of the active layer becomes as thin as 20 to 50 nm, the depletion layer fully extends to the bottom of the active layer, and a fully-depression type (FD type) is realized. When the FD type TFT is made to have a gate overlap type, an electric field is formed in a direction where a hot carrier is hard to generate. On the contrary, when the FD type TFT is made to have a general offset structure, an electric field is formed in a direction where injection of a hot carrier is accelerated.

By making the structure as described above, the NTFT of the present invention can realize high reliability comparable to or higher than a MOSFET. First, a gate voltage is applied to the first impurity region 803 using the side wall 809, so that the same effect as the gate overlap structure can be obtained.

Next, it is possible to realize such a structure that impurity concentration is gradually increased from the channel formation region 802 toward the drain region 806 by arranging the first impurity region 803, the second impurity region 804, and the third impurity region 806.

Further, since the second impurity region 804 which becomes an LDD region and does not overlap with the gate wiring line 808 is provided to be distant from the gate wiring line, it greatly contributes to reduction of an off current of a TFT (a drain current flowing when a TFT is in an off state). Besides, since a hot carrier generated in the first impurity region 803 is injected into the side wall 808 just above the region, a trap level is not formed just above the channel formation region 802.

The foregoing description relates to the NTFF of the present invention, and a P-channel TFT (hereinafter, referred as a PTFT) is made to have a structure where an LDD region and an offset region are not basically provided. Of course, although a structure where the LDD region and the offset region are provided maybe adopted, since the PTFT has originally high reliability, it is preferable to secure an on current and to take a characteristic balance to the NTFT. In the case where the present invention is applied to the CMOS circuit as shown in FIG. 8, especially this characteristic balance is important. However, there is no problem even if the structure of the present invention is applied to the PTFT.

Figure 8:
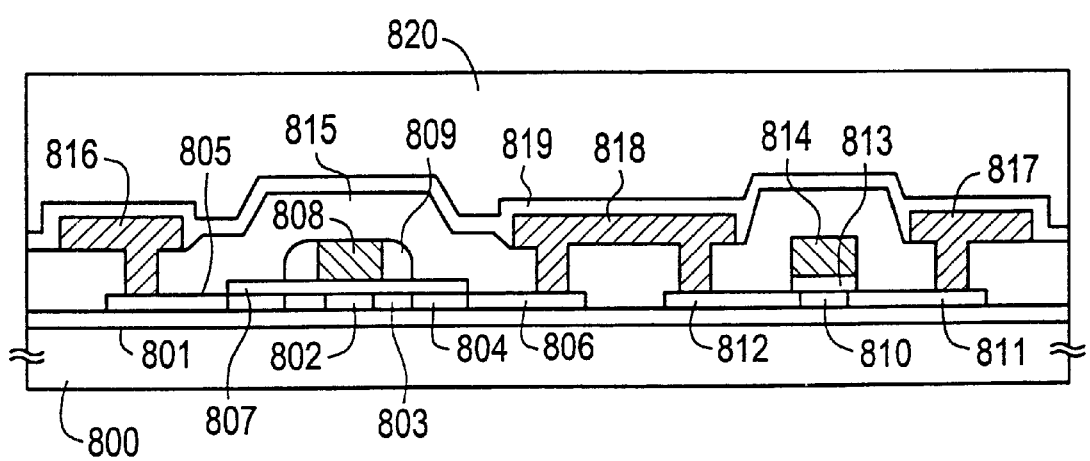
FIG. 8 is a view showing a sectional structure of a CMOS circuit.

In FIG. 8, the active layer of the PTFT is made up of a channel formation region 810, a source region 811, and a drain region 812. A gate insulating film 813 is formed using a gate willing line 814 as a mask in a self-aligned manner. As a feature of the process of the present invention, it is also possible to indicate the point that a side wall exists in the NTFT and a side wall is removed and does not remain in the PTFT.

After the NTFT and the PTFT are formed in this way, they are covered with a first interlayer insulating film 815, and source wiring lines 816 and 817 and drain wiring line 818 are provided. In the structure of FIG. 8, a silicon nitride layer 819 is formed to increase a passivation effect after these wiring lines are provided. A second interlayer insulating film 820 made of a resin material is provided on the silicon nitride layer 819. Although it is not necessary to make limitation to the resin material, it is effective to use the resin material in the sense of securing the flatness.

Until here, although the description has been made on, as an example, the CMOS circuit made by complementarily combining the NTFT and the PTFT, it is also possible to apply the present invention to an NMOS circuit using an NTFT or a pixel TFT formed of an NTFT. Of course, it is also possible to apply the invention to a further complicated semiconductor circuit using the CMOS circuit as a base unit.

[Embodiment 6]

Although the embodiment 5 employs, as a side wall, undoped-Si (intrinsic silicon layer) in which an impurity is not intentionally added, this embodiment employs a phosphorus doped silicon layer ($n^+$-Si layer) added with phosphorus at the time of film formation or a boron doped silicon layer ($p^+$-Si layer). Of course, any of amorphous, crystalline, and microcrystalline layers may be used.

By using the silicon layer added with phosphorus or boron, the resistance of the side wall portion is decreased as a whole, so that it is possible to eliminate a possibility of characteristic variation due to fluctuation in the profile of phosphorus concentration, which was anxiety in the step of FIG. 6D.

[Embodiment 7]

Although the embodiment 5 employs, as a side wall, undoped-Si (intrinsic silicon layer) in which an impurity is not intentionally added, this embodiment employs a silicon layer containing either one of carbon (C), nitrogen (N), and oxygen (O) to increase the resistance component of the side wall. Of course, any of amorphous, crystalline, and microcrystalline layers may be used as the silicon layer.

Since the resistance component due to the side wall becomes large by making the structure of this embodiment, it is possible to make such a structure that a capacitance component using the side wall as a dielectric becomes dominant at application of a gate voltage. That is, it becomes possible to apply an effective gate voltage to the side wall portion as well when high frequency driving is made.

[Embodiment 8]

In this embodiment, a description will be made on an example in which a differential amplifier circuit is formed of a CMOS circuit fabricated through the fabricating steps shown in the embodiment 1 or the embodiment 2. Specifically, a description will be made on an example where an operational amplifier circuit including the differential amplifier circuit is formed.

Figure 9A:
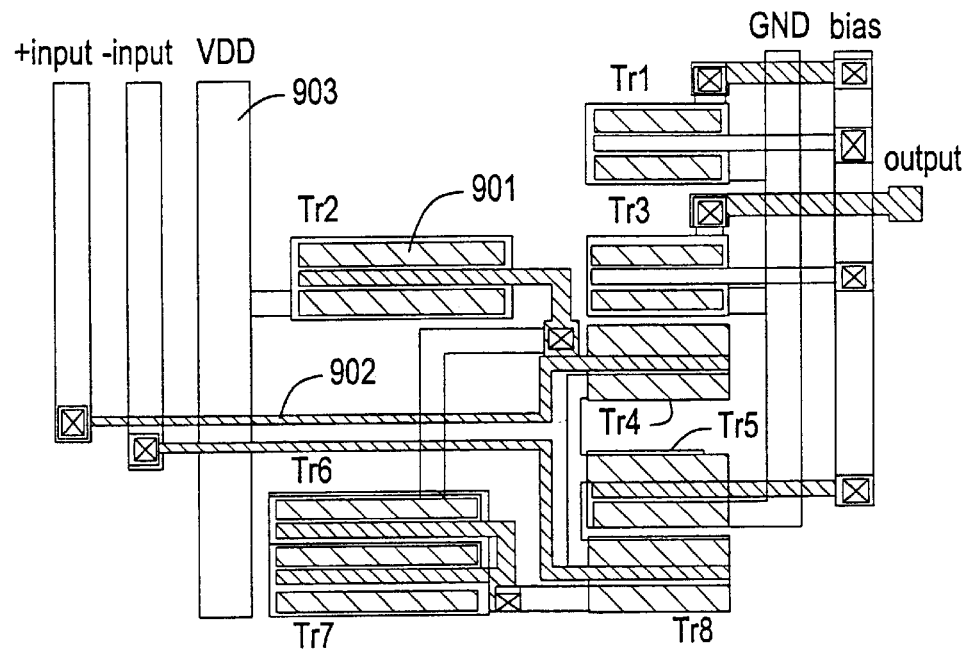
FIGS. 9A and 9B are a top view of an operational amplifier and a view showing its equivalent circuit.
Figure 9B:
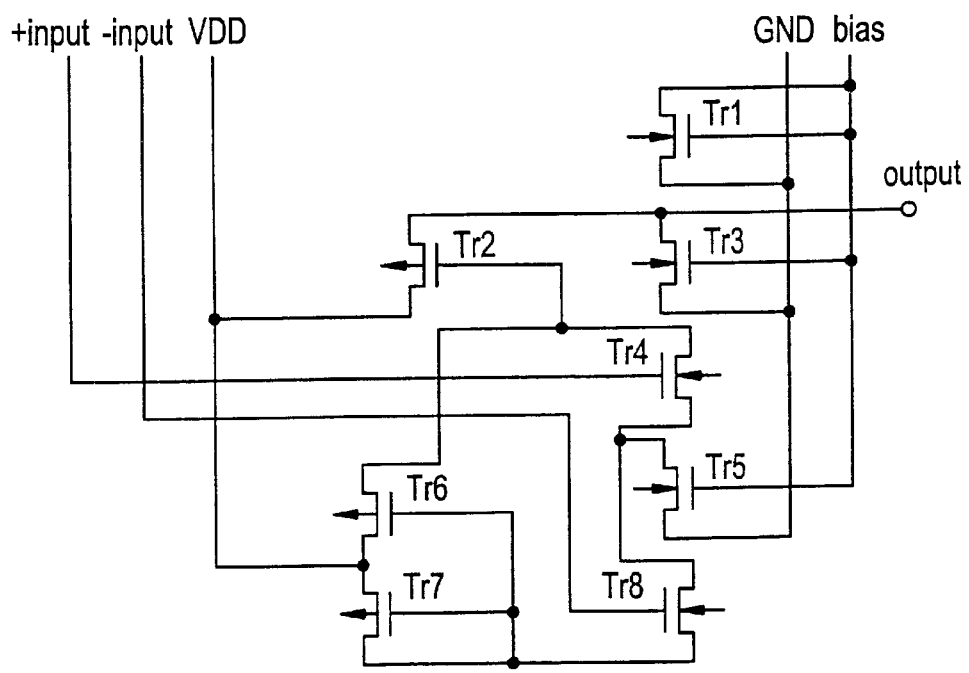

FIG. 9A is a top view of an operational amplifier circuit fabricated in this embodiment, and FIG. 9B is a view of its internal equivalent circuit. In FIGS. 9A and 9B, reference characters Tr1 to Tr8 designate TFTs formed through the fabricating steps of the embodiment 1.

In FIG. 9A, reference numeral 901 designates an active layer obtained through the fabricating steps of the embodiment 1, and constitutes the TFTs Tr1 to Tr8. Reference numeral 902 designates a first wiring line, and is used as a gate wiring line of a TFT or a lead wiring line for output. In the drawing, all wiring lines with the same hatching is wiring lines of the same layer.

Reference numeral 903 designates a second wiring line, and connects a TFT to an input terminal, a power source terminal (VDD terminal), a ground terminal (GND terminal), a bias terminal, and the like.

At this time, it is important that electric characteristics of both the TFTs Tr8 and Tr4 (or Tr6 and Tr7) forming a differential amplifier circuit which becomes an input portion are equal to each other. The differential amplifier circuit has a feature that even if temperature or power source voltage is changed, since the change is applied to the two TFTs at the same time, the output is not influenced. However, if a characteristic difference exists between both the TFTs, it is amplified to produce a large error.

Since the TFTs of the present invention formed through the fabricating steps described in the embodiment 1 have very small fluctuation in electric characteristics, they are very effective in formation of a circuit which is weak to characteristic fluctuation, such as an operational amplifier circuit.

That is, by the fabricating steps of the embodiment 1 which have both the structure that a base film and a semiconductor film are continuously formed on a substrate without exposing to the air and the structure that an active layer is formed of a layer where a crystal grain boundary has continuity, a high performance operational amplifier circuit can be formed of TFTs on a substrate other than a silicon wafer.

Like this, the present invention is a very effective technique in formation of a circuit which is apt to receive an influence of fluctuation in TFT characteristics, and the effect is applied to not only the operational amplifier circuit but also any circuits. Particularly, the present invention is suitable for a D/A converter circuit (or an A/D converter circuit) using an operational amplifier circuit as a buffer circuit, a current mirror circuit including a differential amplifier circuit, and the like.

Incidentally, when the operational amplifier circuit is formed, although the process of the embodiment 1 or the embodiment 2 is used, any structure of the embodiments 3 to 7 may be combined therewith.

[Embodiment 9]

In this embodiment, a description will be made on an example in which a D/A converter circuit is formed through the fabricating steps described in the embodiment 1 or the embodiment 2.

Since TFTs with very small fluctuation in characteristics can be formed in the present invention, the invention is suitable for a circuit sensitive to fluctuation in on current or fluctuation in threshold voltage. As one of such circuits, it is possible to mention a D/A converter circuit incorporated in a liquid crystal display device with very fine gradation display.

Figure 10:
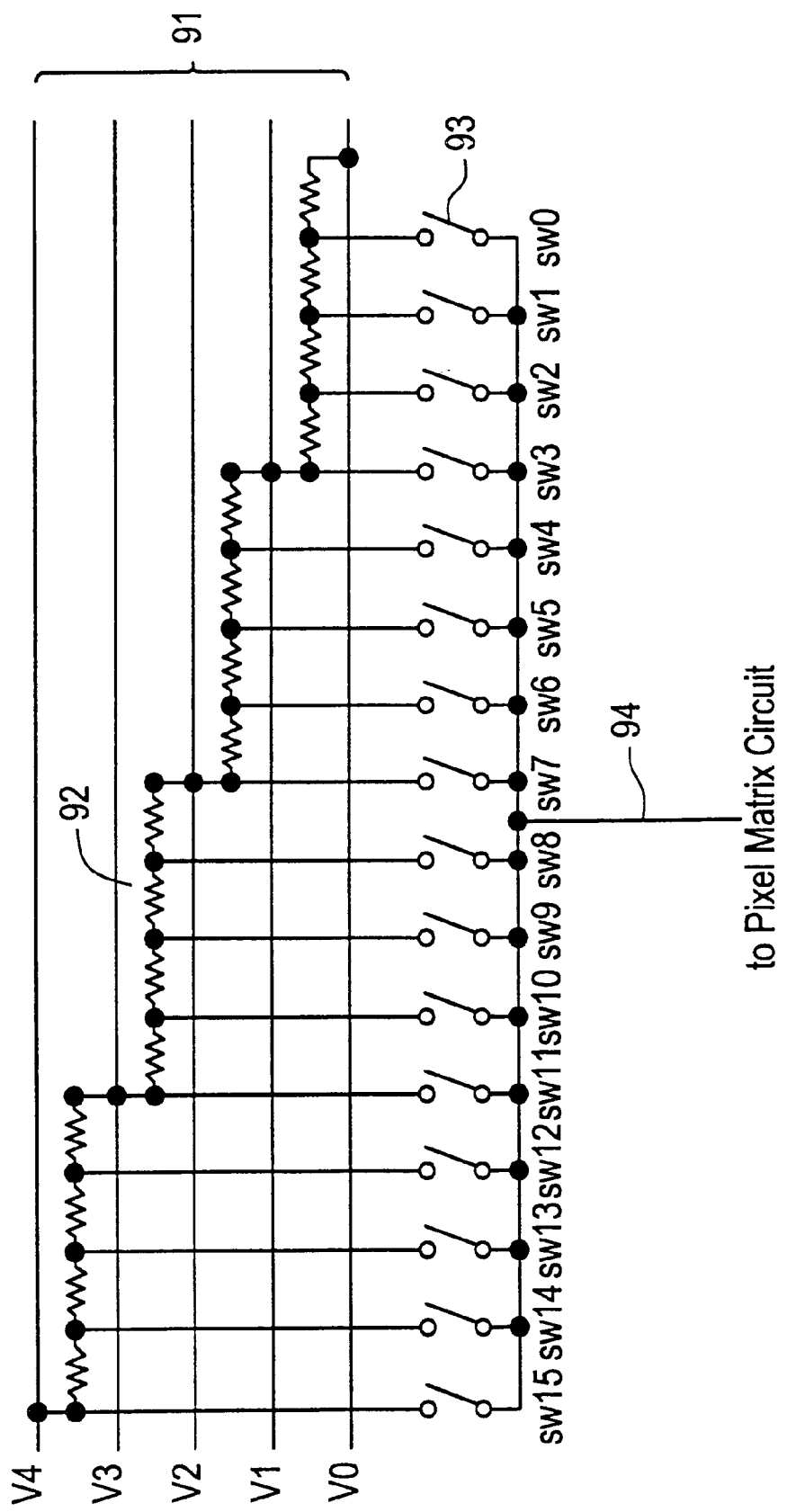
FIG. 10 is a view showing an equivalent circuit of a D/A converter circuit.

FIG. 10 shows a D/A converter circuit of this embodiment. The D/A converter circuit shown in FIG. 10 is for digital gradation of 4 bits. Data of different voltage levels are sent to each of data signal lines 91 indicated by V0 to V4. In the case of this embodiment, a resistor 92 is provided between the respective data signal lines, so that an intermediate voltage is formed.

That is, although the number of data signal lines themselves is five, it is possible to actually realize voltage levels corresponding to sixteen data signal lines. A TFT 93 for switching is provided correspondingly to each of the voltage levels, and a selected data signal is transmitted to a source wiring line 94 connected to a pixel matrix circuit.

Although image display of 16 gradations becomes possible in such a D/A converter circuit, when the circuit is actually used, it is more complicated so as to realize high gradations like 256 gradations or 1024 gradations, and the number of data signal lines becomes enormous. In such a case, a difference of a voltage level for every gradation becomes very fine, for example, several mV or less.

That is, since the amount of electric charge held in each pixel is changed by an on current which is made to flow by the TFT 93 as the switching element, if the on current fluctuates, there occurs such a problem that an accurate amount of electric charge can not be held in the liquid crystal. Of course, it is needless to say that the fluctuation in the on current is greatly influenced by the fluctuation in the threshold voltage and the fluctuation in the subthreshold coefficient.

If the amount of electric charge held by the liquid crystal fluctuates, desired gradation display becomes impossible, so that accurate image display becomes impossible.

Thus, since data signals to be processed become very subtle as the gradation display of a liquid crystal display device becomes fine, there occurs a problem that image display with high fineness becomes impossible due to the fluctuation in characteristics of TFTs. However, in the D/A converter of the present invention, since the characteristic fluctuation of the respective TFTs is very small, the problem as set forth above can be prevented.

Of course, although the D/A converter circuit (or A/D converter circuit) of this embodiment can be fabricated on the basis of the embodiment 1 or 2, any structure of the embodiments 3 to 7 may be freely combined with the embodiment 1 or the embodiment 2.

[Embodiment 10]

For an electro-optical device of the present invention, specifically for a liquid crystal display device of the present invention, various liquid crystals other than a nematic liquid crystal can be used. For example, it is possible to use a liquid crystal disclosed in 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), 671–673, "Thresholdless antiferroelectricity in liquid crystals and its application to displays" by S. Inui et al.; or U.S. Pat. No. 5,594,569.

Figure 15:
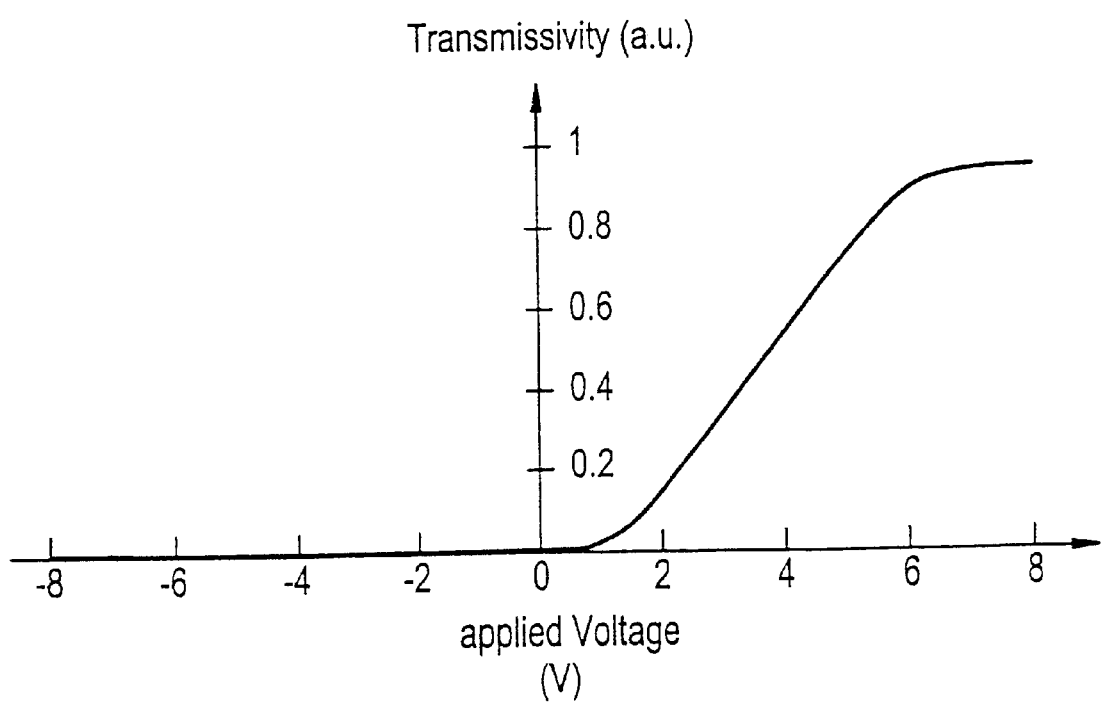
FIG. 15 is a view showing electro-optical characteristics of a liquid crystal.

FIG. 15 shows electro-optical characteristics of single stable ferroelectric liquid crystal (FLC) in which the ferroelectric liquid crystal (FLC) exhibiting a transition series of isometric phase—cholesteric phase—chiral smectic phase is used, transition of cholesteric phase—chiral smectic phase is caused while applying a DC voltage, and a cone edge is made to almost coincide with a rubbing direction.

A display mode by the ferroelectric liquid crystal as shown in FIG. 15 is called a "Half V-shaped switching mode". The vertical axis of the graph shown in FIG. 15 indicates transmissivity (in an arbitrary unit) and the horizontal axis indicates applied voltage. The details of the "Half V-shaped switching mode" is described in "Half V-shaped switching mode FLCD" by Terada et al., Collection of Preliminary Paper for 46th Applied Physics Concerned Joint Lecture Meeting, March 1993, p. 1316, and "Time-division full-color LCD with ferroelectric liquid crystal" by Yoshihara et al., Liquid Crystal, Vol. 3, No. 3, p. 190.

As shown in FIG. 15, it is understood that when such a ferroelectric mixed liquid crystal is used, low voltage driving and gradation display becomes possible. For the liquid crystal display device of the present invention, it is also possible to use the ferroelectric liquid crystal exhibiting such electro-optical characteristics.

A liquid crystal exhibiting antiferroelectricity in some temperature range is called an antiferroelectric liquid crystal (AFLC). In mixed liquid crystals including the antiferroelectric liquid crystal, there is one called a thresholdless antiferroelectric mixed liquid crystal exhibiting electro-optical response characteristics in which transmittance is continuously changed with respect to an electric field. Some thresholdless antiferroelectric mixed liquid crystal exhibits so-called V-shaped electro-optical response characteristics, and a liquid crystal in which its driving voltage is about ±2.5 V (cell thickness is about 1 $\mu$m to 2 $\mu$m) has also been found.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large holding capacitance for a pixel. Thus, it is preferable to use the thresholdless antiferroelectric mixed liquid crystal having small spontaneous polarization.

Since low voltage driving can be realized by using such a thresholdless antiferroelectric mixed liquid crystal for the liquid crystal display device of the present invention, low power consumption can be realized.

The liquid crystal described in this embodiment can be used for a liquid crystal display device having any structure of the embodiments 1 to 7.

[Embodiment 11]

This example demonstrates a process for producing an EL (electroluminescence) display device according to the invention of the present application.

Figure 16A:
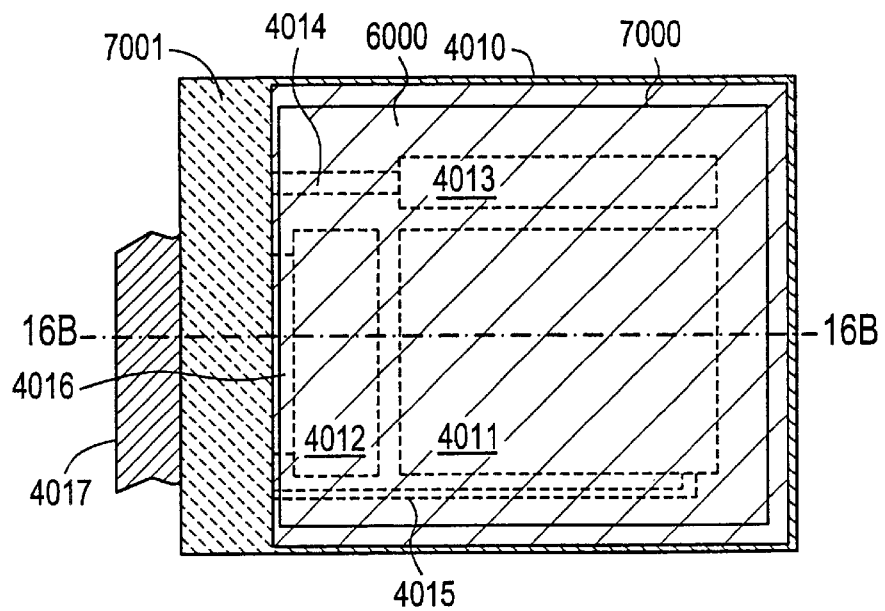
FIGS. 16A and 16B are a top view and a cross sectional view of the structure of an EL display device, respectively.

FIG. 16A is a top view showing an EL display device, which was produced according to the invention of the present application. In FIG. 16A, there are shown a substrate 4010, a pixel part 4011, a driving circuit from the source 4012, and a driving circuit from the gate 4013, each driving circuit connecting to wirings 4014 to 4016 which reach FPC 4017 leading to external equipment.

The pixel part, preferably together with the driving circuit, is enclosed by a covering material 6000, a sealing material (or housing material) 7000, and an end-sealing material (or second sealing material) 7001.

Figure 16B:
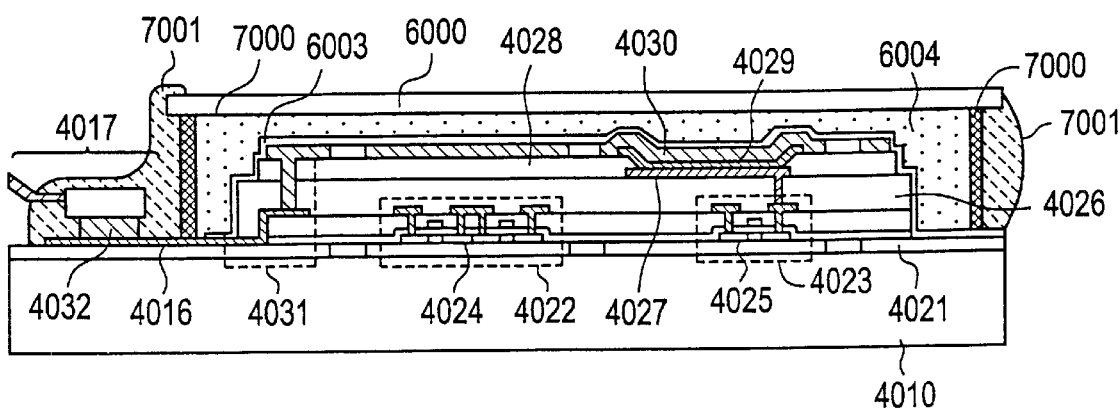

FIG. 16B is a sectional view showing the structure of the EL display device in this Example. There is shown a substrate 4010, an underlying coating 4021, a TFT 4022 for the driving circuit, and a TFT 4023 for the pixel unit. (The TFT 4022 shown is a CMOS circuit consisting of an n-channel type TFT and a p-channel type TFT. The TFT 4023 shown is the one, which controls current to the EL element.

The present invention can be carried out when the TFT 4022 for the driver circuit and the TFT 4023 for the pixel portion are formed on the base film 4021.

Upon completion of TFT 4022 (for the driving circuit) and TFT 4023 (for the pixel unit), with their active layer being the semiconductor layer formed according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter may be applied by a simple method such as spin coating, printing, or inkjet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FP.C 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of $\mu$m sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

[Embodiment 12]

In this embodiment, another EL display device having a different structure from the Embodiment 11 is explained, as shown in FIGS. 34A and 34B. The same reference numerals in FIGS. 17A and 17B as in FIGS. 16A and 16B indicate same constitutive elements, so an explanation is omitted.

Figure 17A:
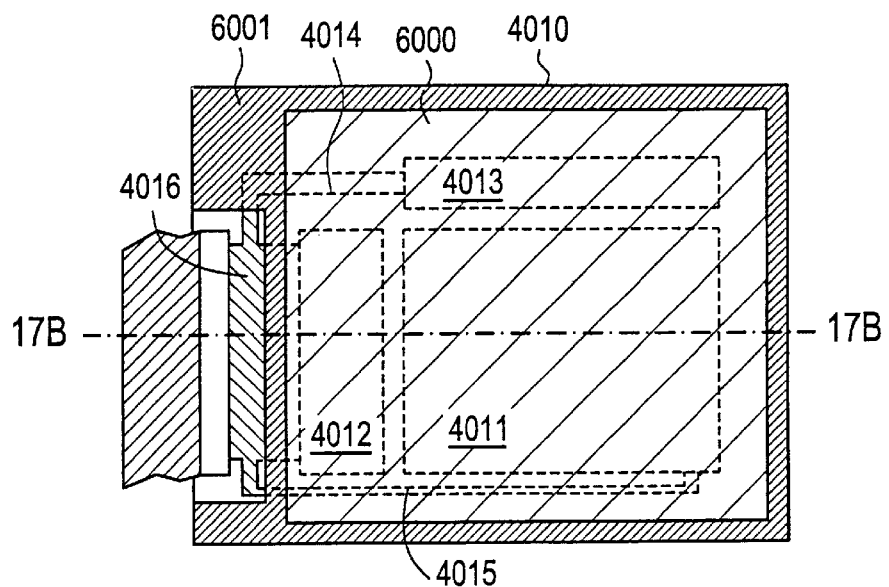
FIGS. 17A and 17B are a top view and a cross sectional view of the structure of an EL display device, respectively.
Figure 17B:
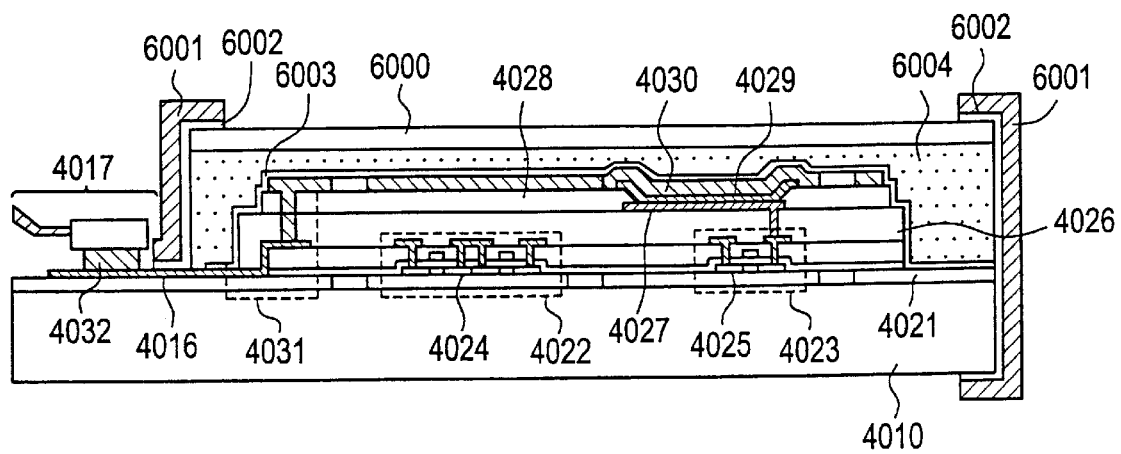

FIG. 17A shows a top view of the EL module in this embodiment and FIG. 17B shows a sectional view of A–A' of FIG. 17A.

According to Embodiment 11, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of $\mu$m sandwiched by a PVF film or a Mylar film.

It is noted that the covering material 6000 should have a light transparency with accordance to a light emitting direction (a light radiation direction) from the EL element.

Next, the covering material 6000 is adhered using the filling material 3404. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

[Embodiment 13]

Figure 18:
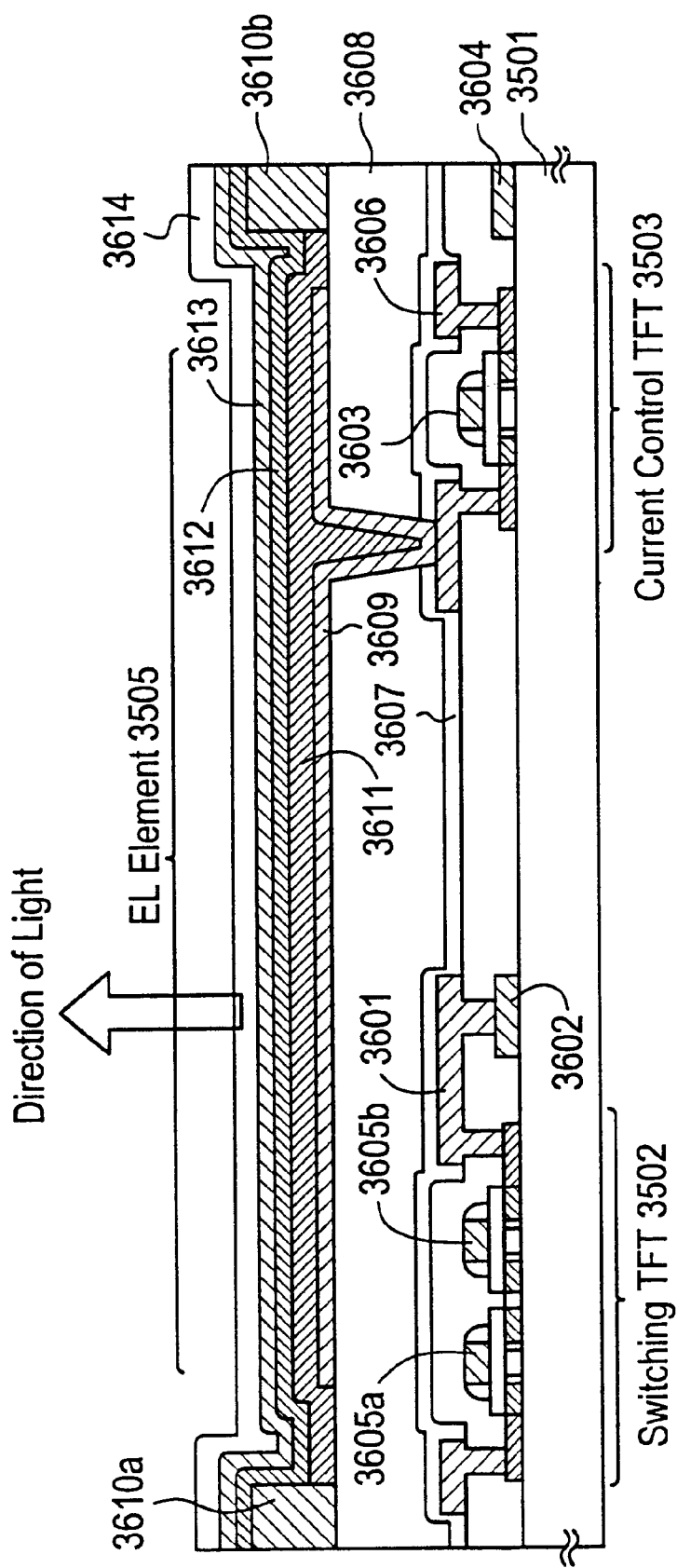
FIG. 18 is a cross sectional view of the structure of an EL display device.
Figure 19A:
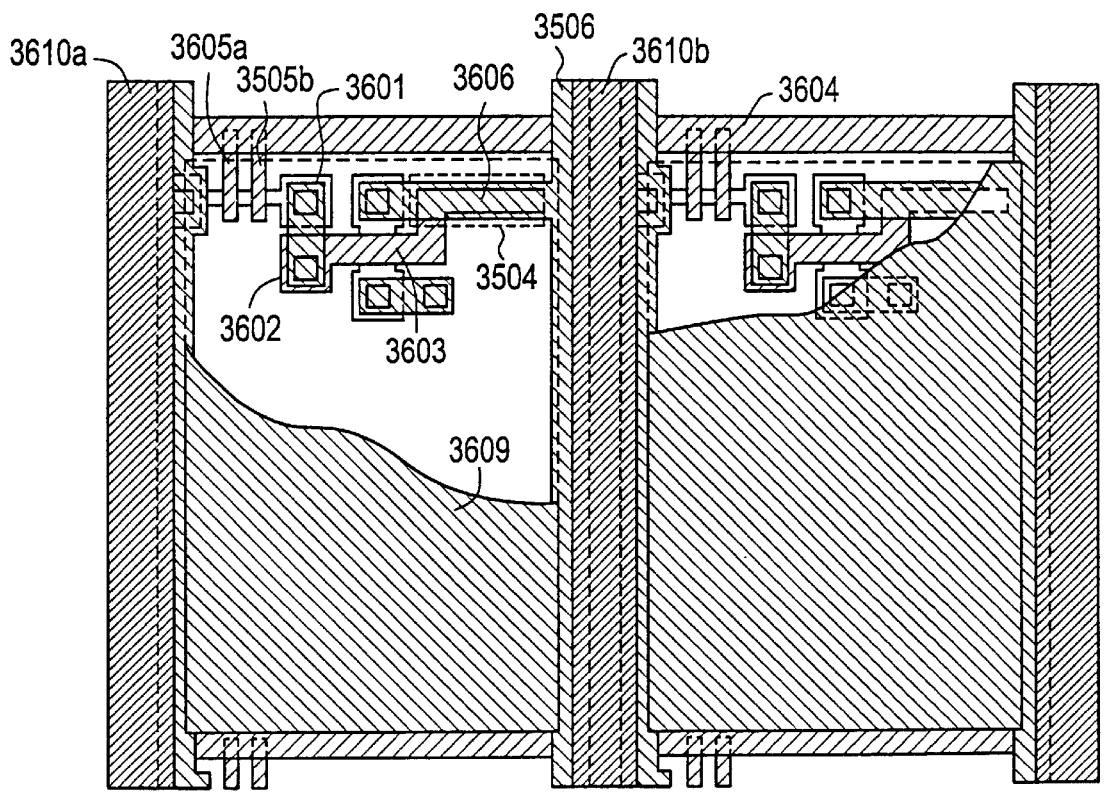
FIGS. 19A and 19B are top view of the structure of an EL display device and the circuit, respectively.
Figure 19B:
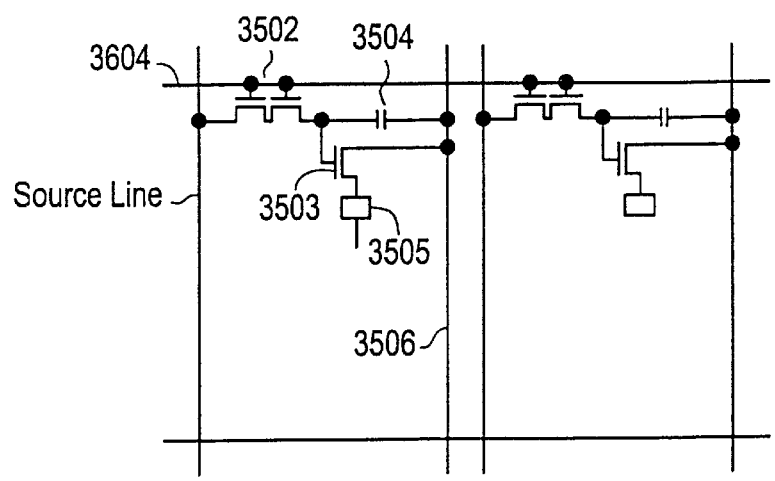

In the EL display device having a structure based on the embodiment 11 or 12, the present invention can be used. In this embodiment, the structure of the pixel region in the panel is illustrated in more detail. FIG. 18 shows the cross section of the pixel region; FIG. 19A shows the top view thereof, and FIG. 19B shows the circuit pattern for the pixel region. In FIG. 18, FIG. 19A and FIG. 19B, the same reference numerals are referred to for the same parts, as being common thereto.

In FIG. 18, the switching TFT 3502 formed on the substrate 3501 is NTFT of the invention (cf. Embodiment 5). In this Embodiment, it has a double-gate structure, but its structure and fabrication process do not so much differ from the structures and the fabrication processes illustrated hereinabove, and their description is omitted herein. However, the double-gate structure of the switching TFT 3502 has substantially two TFTs as connected in series, and therefore has the advantage of reducing the off-current to pass therethrough. In this Embodiment, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is NTFT of the invention. The drain wire 3601 in the switching TFT 3502 is electrically connected with the gate electrode 3603 in the current-control TFT, via the wire 3602 therebetween. The wire indicated by 3604 is a gate wire for electrically connecting the gate electrodes 3605a and 3605b in the switching TFT 3502.

It is very important that the current-control TFT 3503 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which an LDD region is so constructed that the cate electrode overlaps with the drain area in the current-control TFT, via a gate-insulating film therebetween.

In this Embodiment, the current-control TFT 3503 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 19A, the wire to be the gate electrode 3603 in the current-control TFT 3503 overlaps with the drain wire 3606 therein in the region indicated by 3504, via an insulating film therebetween. In this state, the region indicated by 3504 forms a capacitor. The capacitor 3504 functions to retain the voltage applied to the gate in the current-control TFT 3503. The drain wire 3606 is connected with the current supply line (power line) 3506, from which a necessary voltage is applied to the drain wire 3606.

On the switching TFT 3502 and the current-control TFT 3503, formed is a first passivation film 3607. On the film 3607, formed is a planarizing film 3608 of an insulating resin. It is extremely important that the difference in level of the layered parts in TFT is removed through planarization with the planarizing film 3608. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 3609 indicates a pixel electrode (a cathode in the EL device) of an electroconductive film with high reflectivity. The pixel electrode 3609 is electrically connected with the drain in the current-control TFT 3503. It is preferable that the pixel electrode 3609 is of a low-resistance electroconductive film of an aluminium alloy, a copper alloy or a silver alloy, or of a laminate of those films. Needless-to-say, the pixel electrode 3609 may have a laminate structure with any other electroconductive films.

In the recess (this corresponds to the pixel) formed between the banks 3610a and 3610b of an insulating film (preferably of a resin), the light-emitting layer 3611 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include polyparaphenylenevinylene (PVV) materials, polyvinylcarbazole (PVK) materials, polyfluorene materials, etc.

Various types of PVV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33–37" and in Japanese Patent Laid-Open No. 92576/1998. Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Embodiment is to demonstrate the embodiment of using polymer materials to form light-emitting layers, which, however, is not limitative. Apart from this, low-molecular organic-EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 3612 of PEDOT (polythiophene) or PAni (polyaniline) is formed on the light-emitting layer 3611 to give a laminate structure for the EL layer. On the hole injection layer 3612, formed is an anode 3613 of a transparent electroconductive film. In this Embodiment, the light having been emitted by the light-emitting layer 3611 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 3613 is formed, the EL device 3505 is finished. The EL device 3505 thus fabricated herein indicates a capacitor comprising the pixel electrode (cathode) 3609, the light-emitting layer 3611, the hole injection layer 3621 and the anode 3613. As in FIG. 19A, the region of the pixel electrode 3609 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 3614 is formed on the anode 3613. For the second passivation film 3614, preferably used is a silicon nitride film or a silicon oxynitride film. The object of the film 3614 is to insulate the EL device from the outward environment. The film 3614 has the function of preventing the organic EL material from being degraded through oxidation and has the function of preventing it from degassing. With the second passivation film 3614 of that type, the reliability of the EL display device is improved.

As described hereinabove, the EL display panel of the invention fabricated in this Embodiment has a pixel region for the pixel having the constitution as in FIG. 18, and has the switching TFT through which the off-current to pass is very small to a satisfactory degree, and the current-control TFT resistant to hot carrier injection. Accordingly, the EL display panel fabricated herein has high reliability and can display good images.

The constitution of this Embodiment can be combined with any constitution of Embodiments 1 and 2 in any desired manner. Incorporating the EL display panel of this Embodiment into the electronic appliance of Embodiment 17 as its display part is advantageous.

[Embodiment 14]

This Embodiment is to demonstrate a modification of the EL display panel of Embodiment 13, in which the EL device 3505 in the pixel region has a reversed structure. For this Embodiment, referred to is FIG. 20. The constitution of the EL display panel of this Embodiment differs from that illustrated in FIG. 19A only in the EL device part and the current-control TFT part. Therefore, the description of the other parts except those different parts is omitted herein.

Figure 20:
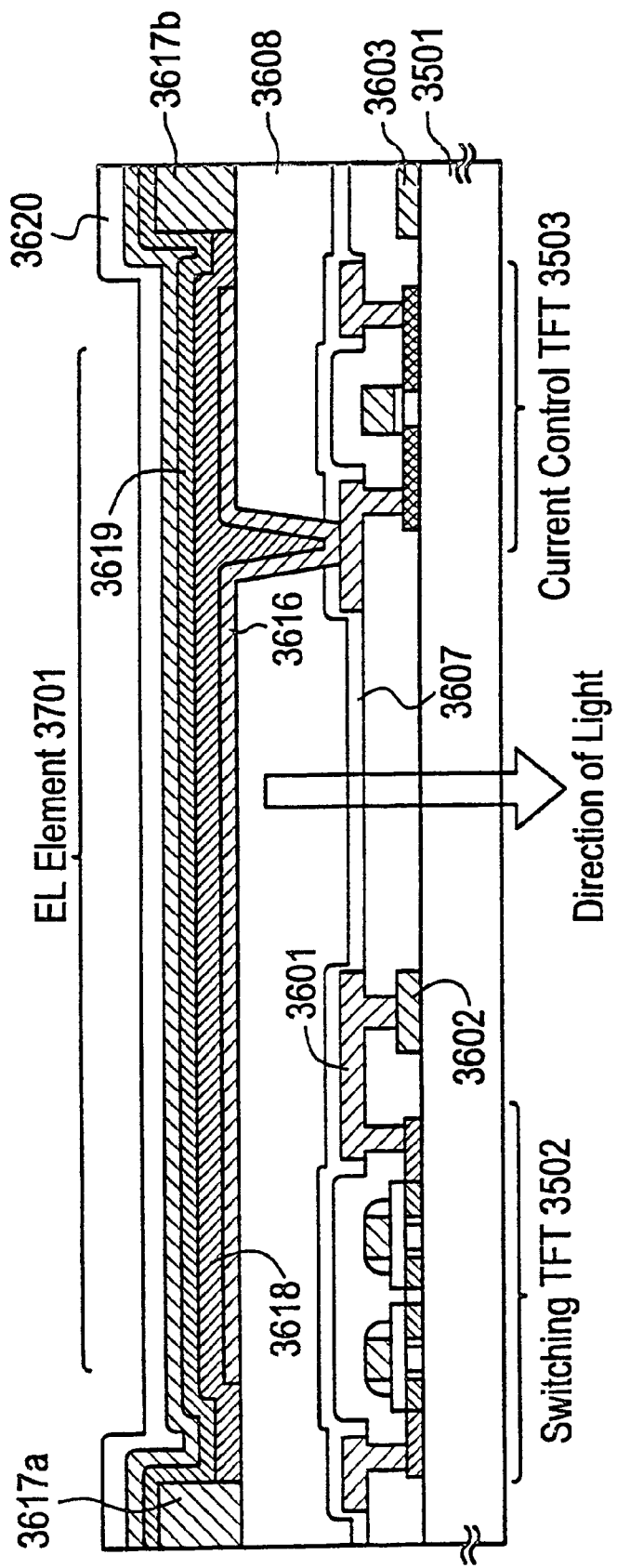
FIG. 20 is a cross sectional view of the structure of an EL display device.

In FIG. 20, the current-control TFT 3701 may be PTFT of the invention. For the process of forming it, referred to is that of Embodiment 5.

In this Embodiment, the pixel electrode (anode) 3616 is of a transparent electroconductive film. Concretely, used is an electroconductive film of a compound of indium oxide and zinc oxide. Needless-to-say, also usable is an electroconductive film of a compound of indium oxide and tin oxide.

After the banks 3617a and 3617b of an insulating film have been formed, a light-emitting layer 3618 of polyvinylcarbazole is formed between them in a solution coating method. On the light-emitting layer 3618, formed are an electron injection layer 3619 of acetylacetonatopotassium (hereinafter acacK), and a cathode 3620 of an aluminium alloy. In this case, the cathode 3620 serves also as a passivation film. Thus is fabricated the EL device 3701.

In this Embodiment, the light having been emitted by the light-emitting layer 3618 radiates in the direction toward the substrate with TFT formed thereon, as in the direction of the arrow illustrated.

The constitution of this Embodiment can be combined with any constitution of Embodiments 1 and 2 in any desired manner. Incorporating the EL display panel of this Embodiment into the electronic appliance of Embodiment 17 as its display part is advantageous.

[Embodiment 15]

This Embodiment is to demonstrate modifications of the pixel with the circuit pattern of FIG. 19B. The modifications are as in FIG. 21A to FIG. 21C. In this Embodiment illustrated in those FIG. 21A to FIG. 21C, 3801 indicates the source wire for the switching TFT 3802; 3803 indicates the gate wire for the switching TFT 3802; 3804 indicates a current-control TFT; 3805 indicates a capacitor; 3806 and 3808 indicate current supply lines; and 3807 indicates an EL device.

Figure 21A:
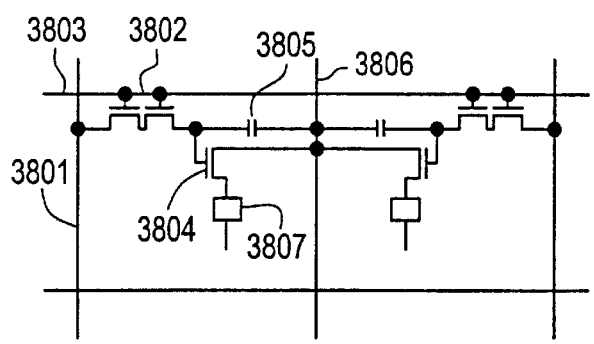
FIGS. 21A to 21C are views showing the circuits of an EL display device.

In the embodiment of FIG. 21A, the current supply line 3806 is common to the two pixels. Specifically, this embodiment is characterized in that two pixels are lineal-symmetrically formed with the current supply line 3806 being the center between them. Since the number of current supply lines can be reduced therein, this embodiment is advantageous in that the pixel pattern can be much finer and thinner.

Figure 21B:
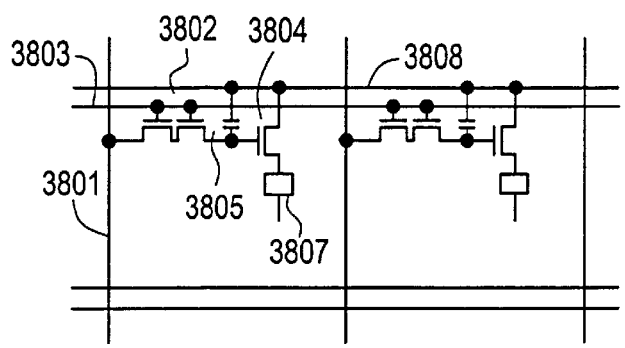

In the embodiment of FIG. 21B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this embodiment is advantageous in that the pixel pattern can be much finer and thinner.

Figure 21C:
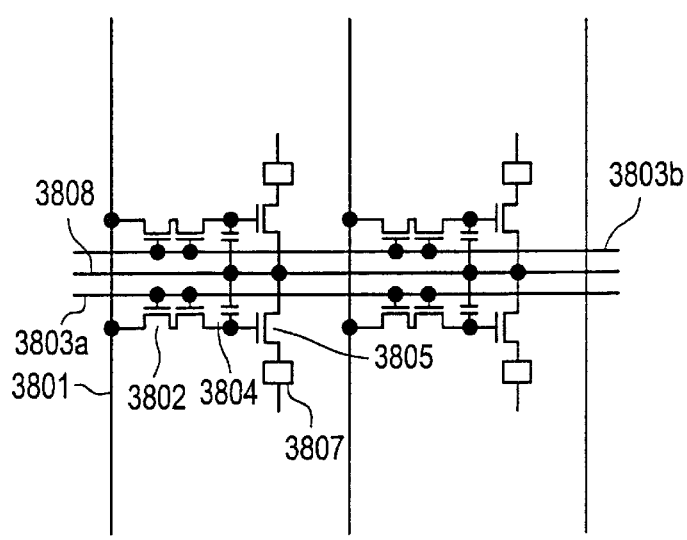

The structure of the embodiment of FIG. 21C is characterized in that the current supply line 3808 is formed in parallel to the gate wires 3803, like in FIG. 21B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this embodiment is advantageous in that the pixel pattern can be much finer and thinner.

The constitution of this Embodiment can be combined with any constitution of Embodiments 1, 2, 11 and 12 in any desired manner. Incorporating the EL display panel having the pixel structure of this Embodiment into the electronic appliance of Embodiment 17 as its display part is advantageous.

[Embodiment 16]

The embodiment of Embodiment 13 illustrated in FIG. 19A and FIG. 19B is provided with the capacitor 3504 which acts to retain the voltage applied to the gate in the current-control TFT 3503. In the embodiment, however, the capacitor 3504 may be omitted.

In the embodiment of Embodiment 13, the current-control TFT 3503 is NTFT of the invention, as shown in Embodiment 5. Therefore, in the embodiment, the LDD region is so formed that it overlaps with the gate electrode via the gate-insulating film therebetween. In the overlapped region, formed is a parasitic capacitance generally referred to as a gate capacitance. The embodiment of this Embodiment is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also in the embodiments of Embodiment 15 illustrated in FIG. 21A, FIG. 21B and FIG. 21C, the capacitor 3805 can be omitted.

The constitution of this Embodiment can be combined with any constitution of Embodiments 1, 2, and 11 to 15 in any desired manner. Incorporating the EL display panel having the pixel structure of this Embodiment into the electronic appliance of Embodiment 17 as its display part is advantageous.

[Embodiment 17]

It is possible to use electro-optical devices or semiconductor circuits as display devices of the electronic equipments or signal processing circuits. As such an electronic equipment, video cameras. digital cameras, projectors. projection televisions, goggle type displays (head mount displays), navigation systems, acoustic reproduction devices, note-type personal computers, game equipments, portable information terminals (such as mobile computers, portable telephones, portable-type game equipment and electronic books), and image reproduction devices having a recording medium, etc. Some examples of these are shown in FIGS. 11A to 11F, FIGS. 17A to 17D and FIGS. 18A to 18B.

Figure 11A:
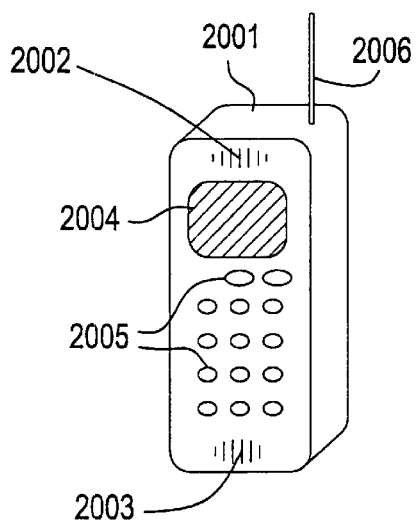
FIGS. 11A to 11F are views showing examples of electronic devices.

FIG. 11A is a portable telephone, and is composed of a main body 2001, a sound output section 2002, a sound input section 2003, a display device 2004, operation switches 2005, and an antenna 2006. The electro-optical devices of the present invention can be applied to the display device 2004 and the semiconductor circuits of the present invention can be applied to the sound output section 2002, the sound input section 2003, CPU memories or the like.

Figure 11B:
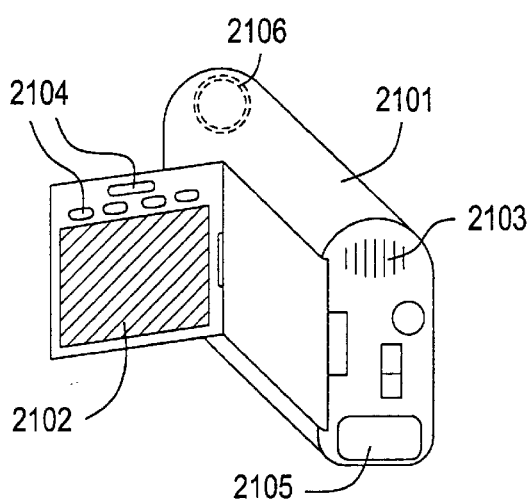

FIG. 11B is a video camera, and is composed of a main body 2101, a display device 2102, a sound input section 2103, operation switches 2104, a battery 2105, and an image receiving section 2106. The electro-optical devices of the present invention can be applied to the display device 2102 and the semiconductor circuits of the present invention are applied to the sound input section 2103, CPU, memories or the like.

Figure 11C:
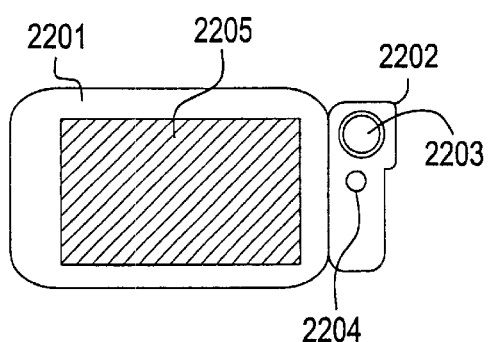

FIG. 11C is a mobile computer, and is composed of a main body 2201, a camera section 2202, an image receiving section 2203, operating switches 2204, and a display device 2205. The electro-optical devices of the present invention can be applied to CPU, memories or the like.

Figure 11D:
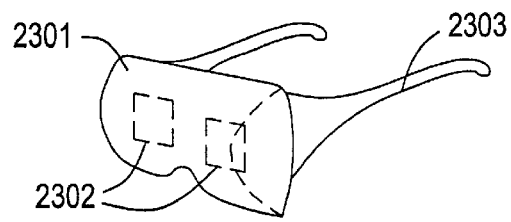

FIG. 11D is a goggle type display, and is composed of a main body 2301, a display device 2302, and an arm section 2303. The electro-optical devices of the present invention can be applied to CPU, memories or the like.

Figure 11E:
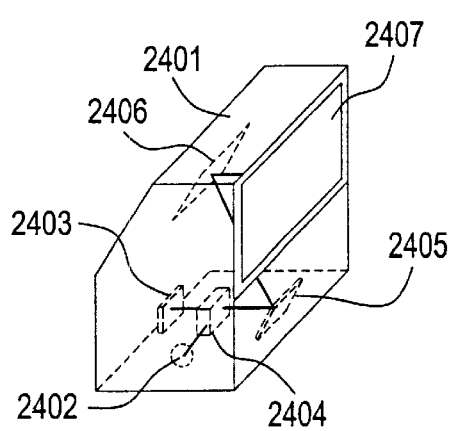

FIG. 11E is a rear type projector (projection television), and is composed of a main body 2401, an optical source 2402, an electro-optical device 2403, polarizing beam splitter 2404, reflectors 2405 and 2406 and a screen 2407. The present invention may be applied to the electro-optical device 2403, and the semiconductor circuits of the present invention may be applied to CPU, memories or the like.

Figure 11F:
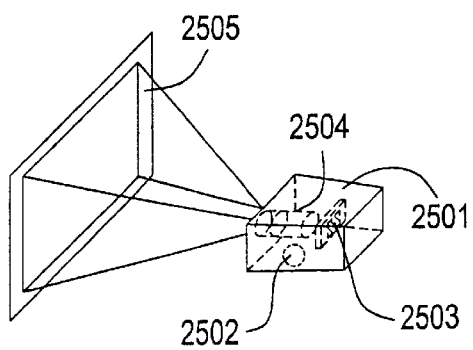

FIG. 11F is a front type projector. and is composed of a main body 2501, an optical source 2502, an electro-optical device 2503, an optical system 2504 and a screen 2505. The present invention can be applied to the electro-optical device 2502, and the semiconductor circuits of the present invention can be applied to CPU, memories or the like.

Figure 22A:
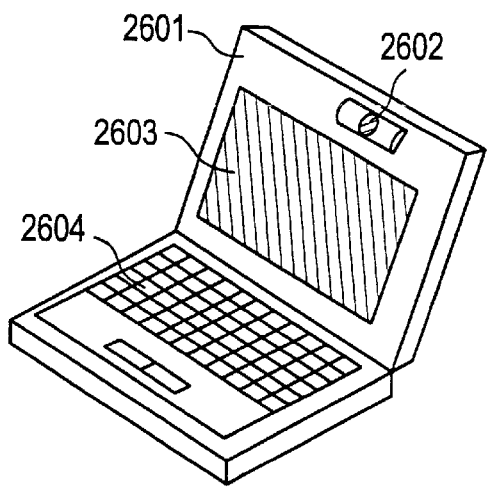
FIGS. 22A to 22D are views showing examples of electronic equipments.
Figure 22B:
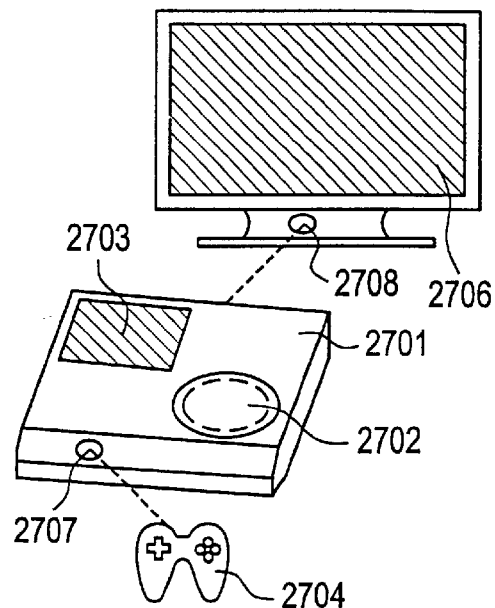

FIG. 22A is a personal computer, and is composed of a main body 2601, an image input section 2602, a display device 2603, a keyboard 2604, etc. The electro-optical device of the present invention can be applied to the display device 2603, and the semiconductor circuits of the present invention can be applied to CPU, memories or the like. FIG. 22B is an electronic game equipment (a game equipment) composing a main body 2701, a recording medium 2702, a display device 2703 and a controller 2704. The image outputted from the electronic game equipment are reproduced in the display device 2706. As communication means between the controller 2704 and the main body 2701 or the electronic game equipment and the display, wired communication, wireless communication or optical communication may be used. In this embodiment, there is employed such a structure that an infrared radiation is detected in sensor portions 2707 and 2708. The electro-optical device of the present invention can be applied to the display devices 2703 and 2706, and the semiconductor circuits of the present invention can be applied to CPU, memories or the like.

Figure 22C:
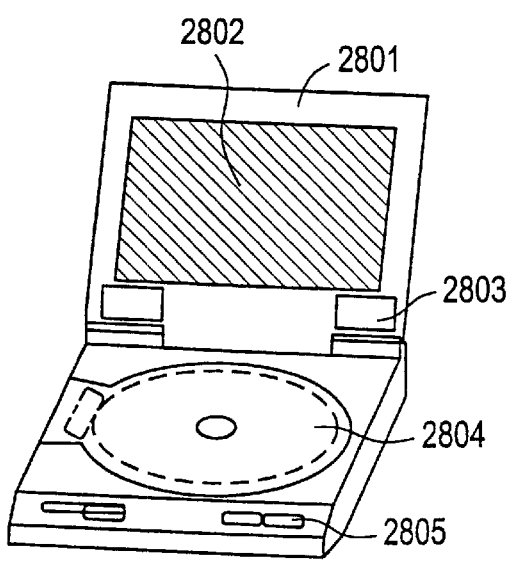

FIG. 22C is a player (image reproduction device) which uses a recording medium on which a program is recorded (hereafter referred to simply as a recording medium), and is composed of a main body 2801, a display device 2802, a speaker section 2803, a recording medium 2804 and operation switches 2805. Note that a DVD (digital versatile disk), or CD as a recording medium for this device, and that it can be used for music appreciation, film appreciation, games, and the Internet. The present invention can be applied to display device 2802, CPU, memories or the like.

Figure 22D:
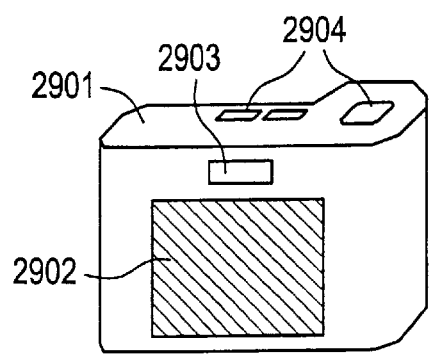

FIG. 22D is a digital camera, and is composed of a main body 2901, a display device 2902, an eyepiece section 2903, operation switches 2904 and an image receiving section (not shown). The present invention can be applied to the display device 2902, CPU, memories or the like.

Figure 23A:
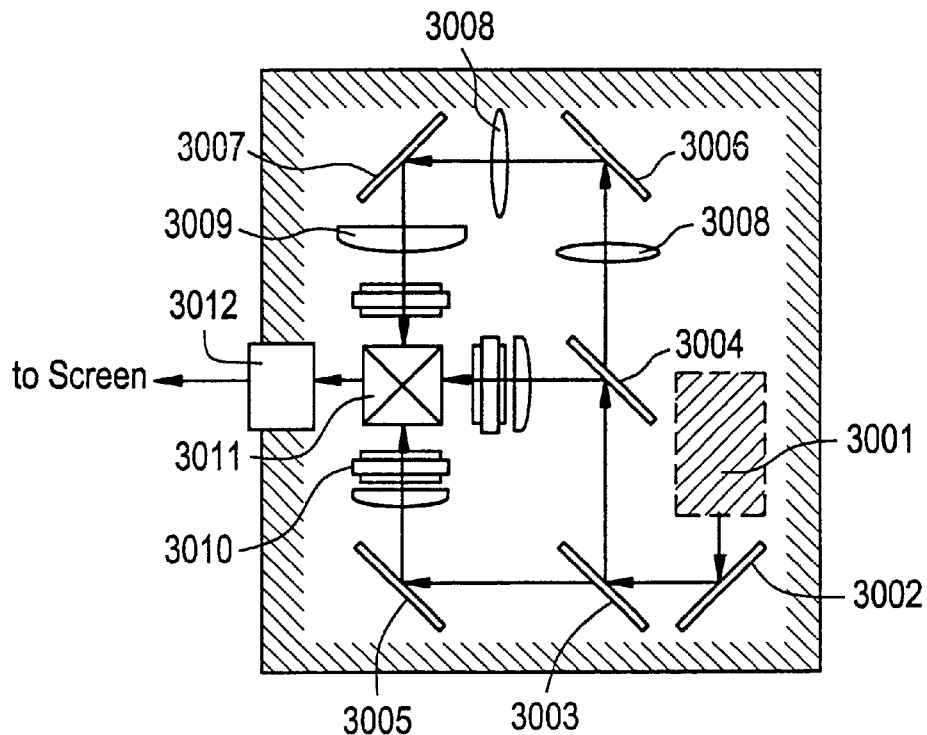
FIGS. 23A and 23B are views showing structures of optical engines.

The detailed description of an optical engine that is applicable to the rear-type projector in FIG. 11E and the front-type projector in FIG. 11F is shown in FIG. 23A and 18B. FIG. 23A is an optical engine and FIG. 23B is an optical light source system incorporated to the optical engine.

The optical engine shown in FIG. 23A consists of an optical light source system 3001, mirrors 3002 and 3005 to 3007, dichroic mirrors 3003 and 3004, optical lenses 3008 and 3009, a prism 3011, a liquid crystal display device 3010, and an optical projection system 3012. The optical projection system 3012 is composed of an optical system provided with a projection lens. Embodiment 12 shows an example in which the liquid crystal display device 3010 is triple stage using three lenses, but there are no special limits and a simple stage is acceptable, for example. Further, the operator may provide optical lenses, a film having a polarization function, a film to regulate the phase difference, IR films, etc., suitably within the optical path shown by an arrow in FIG. 23A.

Figure 23B:
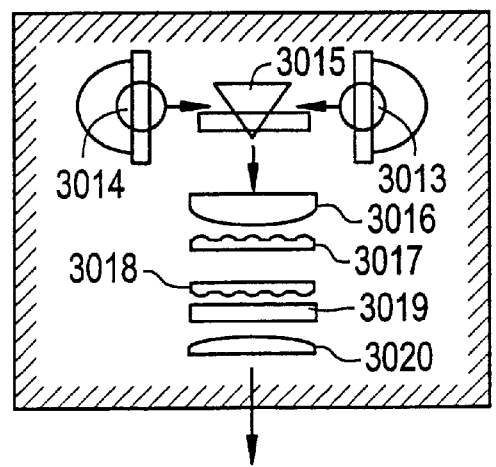

As shown in FIG. 23B, the optical light source system 3001 is composed of light sources 3013 and 3O14, a compound prism 3015, collimator lenses 3016 and 3020, lens arrays 3017 and 3018, and a polarizing conversion element 3019. Note that the optical light source system shown in FIG. 23B uses two light sources, but a single light source is acceptable. Three or more light sources may be used. Further, the operator may provide optical lenses, a film having polarization function, a film to regulate the phase difference, IR films, etc., suitably in the light path of the optical system.

As described above, an applicable range of the present invention is extremely wide, and it can be applied to electronic equipment in all fields. Further, the manufacture of the electronic equipment of the present embodiment can be realized by using a structure in combination with any of embodiments 1 to 16.

According to the present invention disclosed in the present specification, it is possible to greatly reduce fluctuation in characteristics of a TFT using a semiconductor thin film having crystallinity comparable to a single crystal semiconductor. Then a high performance semiconductor circuit and electro-optical device can be formed by using such TFTs.

Accordingly, such a semiconductor circuit and an electro-optical device, and an electronic equipment of the invention using those as parts have extremely high performance, and become very excellent in functionality, portability, and reliability.

Although the case of {110} orientation has been explained in the specification, it is possible to obtain the effect of the present invention in a {111} zone plane orientation which is perpendicular to {111} plane orientation, which representatively comprises plane orientations {110}, {211}, {321}, {431}, {532} and {541}.

What is claimed is:

1. A portable telephone comprising a plurality of thin film transistors over a substrate, each of the plurality of thin film transistors comprising:

a crystalline semiconductor layer having at least a source, a drain, and a channel formation regions over the substrate, the channel formation region comprising at least one selected from the group consisting of {110}, {211}, {321}, {431}, {532}, and {541} plane orientations, wherein standard deviations are 0.1 V or less, and 10 mV/dec or less, respectively, when a collective of threshold voltages and a collective of subthreshold coefficients exhibited by the plurality of respective thin film transistors are made a population.

2. A portable telephone according to claim 1, wherein the crystalline semiconductor layer comprises $Si_xGe_{(1-x)}$ ($0.9 \leq x \leq 0.99$).

3. A portable telephone according to claim 1, wherein the plane orientations are observed by an electron beam diffraction pattern when an electron beam is vertically irradiated to the semiconductor layer.

4. A portable telephone according to claim 1, wherein the substrate comprises a quartz substrate.

5. A video camera comprising a plurality of thin film transistors over a substrate, each of the plurality of thin film transistors comprising:

a crystalline semiconductor layer having at least a source, a drain, and a channel formation regions over the substrate, the channel formation region comprising at least one selected from the group consisting of {110}, {211}, {321}, {431}, {532}, and {541} plane orientations, wherein standard deviations are 0.1 V or less, and 10 mV/dec or less, respectively, when a collective of threshold voltages and a collective of subthreshold coefficients exhibited by the plurality of respective thin film transistors are made a population.

6. A video camera according to claim 5, wherein the crystalline semiconductor layer comprises $Si_xGe_{(1-x)}$ ($0.9 \leq x \leq 0.99$).

7. A video camera according to claim 5, wherein the plane orientations are observed by an electron beam diffraction pattern when an electron beam is vertically irradiated to the semiconductor layer.

8. A video camera according to claim 5, wherein the substrate comprises a quartz substrate.

9. A mobile computer comprising a plurality of thin film transistors over a substrate, each of the plurality of thin film transistors comprising:

a crystalline semiconductor layer having at least a source, a drain, and a channel formation regions over the substrate, the channel formation region comprising at least one selected from the group consisting of {110}, {211}, {321}, {431}, {532}, and {541} plane orientations, wherein standard deviations are 0.1 V or less, and 10 mV/dec or less, respectively, when a collective of threshold voltages and a collective of subthreshold coefficients exhibited by the plurality of respective thin film transistors are made a population.

10. A mobile computer according to claim 9, wherein the crystalline semiconductor layer comprises $Si_xGe_{(1-x)}$ ($0.9 \leq x \leq 0.99$).

11. A mobile computer according to claim 9, wherein the plane orientations are observed by an electron beam diffraction pattern when an electron beam is vertically irradiated to the semiconductor layer.

12. A mobile computer according to claim 9, wherein the substrate comprises a quartz substrate.

13. A goggle-type display comprising a plurality of thin film transistors over a substrate, each of the plurality of thin film transistors comprising:

a crystalline semiconductor layer having at least a source, a drain, and a channel formation regions over the substrate, the channel formation region comprising at least one selected from the group consisting of {110}, {211}, {321}, {431}, {532}, and {541} plane orientations, wherein standard deviations are 0.1 V or less, and 10 mV/dec or less, respectively, when a collective of threshold voltages and a collective of subthreshold coefficients exhibited by the plurality of respective thin film transistors are made a population.

14. A goggle-type display according to claim 13, wherein the crystalline semiconductor layer comprises $Si_xGe_{(1-x)}$ ($0.9 \leq x \leq 0.99$).

15. A goggle-type display according to claim 13, wherein the plane orientations are observed by an electron beam diffraction pattern when an electron beam is vertically irradiated to the semiconductor layer.

16. A goggle-type display according to claim 13, wherein the substrate comprises a quartz substrate.

17. A projector comprising a plurality of thin film transistors over a substrate, each of the plurality of thin film transistors comprising:

a crystalline semiconductor layer having at least a source, a drain, and a channel formation regions over the substrate, the channel formation region comprising at least one selected from the group consisting of {110}, {211}, {321}, {431}, {532}, and {541} plane orientations, wherein standard deviations are 0.1 V or less, and 10 mV/dec or less, respectively, when a collective of threshold voltages and a collective of subthreshold coefficients exhibited by the plurality of respective thin film transistors are made a population.

18. A projector according to claim 17, wherein the crystalline semiconductor layer comprises $Si_xGe_{(1-x)}$ ($0.9 \leq x \leq 0.99$).

19. A projector according to claim 17, wherein the plane orientations are observed by an electron beam diffraction pattern when an electron beam is vertically irradiated to the semiconductor layer.

20. A projector according to claim 17, wherein the substrate comprises a quartz substrate.

21. A personal computer comprising a plurality of thin film transistors over a substrate, each of the plurality of thin film transistors comprising:

a crystalline semiconductor layer having at least a source, a drain, and a channel formation regions over the substrate, the channel formation region comprising at least one selected from the group consisting of {110}, {211}, {321}, {431}, {532}, and {541} plane orientations, wherein standard deviations are 0.1 V or less, and 10 mV/dec or less, respectively, when a collective of threshold voltages and a collective of subthreshold coefficients exhibited by the plurality of respective thin film transistors are made a population.

22. A personal computer according to claim 21, wherein the crystalline semiconductor layer comprises $Si_xGe_{(1-x)}$ ($0.9 \leq x \leq 0.99$).

23. A personal computer according to claim 21, wherein the plane orientations are observed by an electron beam diffraction pattern when an electron beam is vertically irradiated to the semiconductor layer.

24. A personal computer according to claim 21, wherein the substrate comprises a quartz substrate.

25. A electronic game equipment comprising a plurality of thin film transistors over a substrate, each of the plurality of thin film transistors comprising:

a crystalline semiconductor layer having at least a source, a drain, and a channel formation regions over the substrate, the channel formation region comprising at least one selected from the group consisting of {110}, {211}, {321}, {431}, {532}, and {541 } plane orientations, wherein standard deviations are 0.1 V or less, and 10 mV/dec or less, respectively, when a collective of threshold voltages and a collective of subthreshold coefficients exhibited by the plurality of respective thin film transistors are made a population.

26. A electronic game equipment according to claim 25, wherein the crystalline semiconductor layer comprises $Si_xGe_{(1-x)}$ ($0.9 \leq x \leq 0.99$).

27. A electronic game equipment according to claim 25, wherein the plane orientations are observed by an electron beam diffraction pattern when an electron beam is vertically irradiated to the semiconductor layer.

28. A electronic game equipment according to claim 25, wherein the substrate comprises a quartz substrate.

29. A player using a recording medium comprising a plurality of thin film transistors over a substrate, each of the plurality of thin film transistors comprising:
   a crystalline semiconductor layer having at least a source, a drain, and a channel formation regions over the substrate, the channel formation region comprising at least one selected from the group consisting of {110}, {211}, {321}, {431}, {532}, and {541} plane orientations,
   wherein standard deviations are 0.1 V or less, and 10 mV/dec or less, respectively, when a collective of threshold voltages and a collective of subthreshold coefficients exhibited by the plurality of respective thin film transistors are made a population.

30. A player using a recording medium according to claim 29, wherein the crystalline semiconductor layer comprises $Si_xGe_{(1-x)}$ ($0.9 \leq x \leq 0.99$).

31. A player using a recording medium according to claim 29, wherein the plane orientations are observed by an electron beam diffraction pattern when an electron beam is vertically irradiated to the semiconductor layer.

32. A player using a recording medium according to claim 29, wherein the substrate comprises a quartz substrate.

33. A digital camera comprising a plurality of thin film transistors over a substrate, each of the plurality of thin film transistors comprising:
   a crystalline semiconductor layer having at least a source, a drain, and a channel formation regions over the substrate, the channel formation region comprising at least one selected from the group consisting of {110}, {211}, {321}, {431}, {532}, and {541} plane orientations,
   wherein standard deviations are 0.1 V or less, and 10 mV/dec or less, respectively, when a collective of threshold voltages and a collective of subthreshold coefficients exhibited by the plurality of respective thin film transistors are made a population.

34. A digital camera according to claim 33, wherein the crystalline semiconductor layer comprises $Si_xGe_{(1-x)}$ ($0.9 \leq x \leq 0.99$).

35. A digital camera according to claim 33, wherein the plane orientations are observed by an electron beam diffraction pattern when an electron beam is vertically irradiated to the semiconductor layer.

36. A digital camera according to claim 33, wherein the substrate comprises a quartz substrate.

37. A semiconductor device comprising a plurality of thin film transistors over a substrate, each of the plurality of thin film transistors comprising:
   a $Si_xGe_{(1-x)}$ layer having at least a source, a drain, and a channel formation regions over the substrate, the channel formation region comprising at least {211} plane orientation.

38. A semiconductor device according to claim 37, wherein the x is between 0.9 and 0.99.

39. A semiconductor device according to claim 37, wherein the plane orientation is observed by an electron beam diffraction pattern when an electron beam is vertically irradiated to the semiconductor layer.

40. A semiconductor device according to claim 37, wherein the substrate comprises a quartz substrate.

41. A semiconductor device according to claim 37, wherein the semiconductor device is an EL display device.

42. A semiconductor device according to claim 37, wherein the semiconductor device is at least one selected from the group consisting of a portable telephone, a video camera, a mobile computer, a goggle-type display, a projector, a personal computer, an electronic game equipment, a player using a recording medium, and a digital camera.

* * * * *